(12) United States Patent
Yoshimura et al.

(10) Patent No.: US 9,331,695 B2
(45) Date of Patent: May 3, 2016

(54) SEMICONDUCTOR DEVICE

(71) Applicant: HITACHI, LTD., Tokyo (JP)

(72) Inventors: Chihiro Yoshimura, Tokyo (JP); Masanao Yamaoka, Tokyo (JP); Masato Hayashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/638,205

(22) Filed: Mar. 4, 2015

(65) Prior Publication Data

US 2016/0065210 A1 Mar. 3, 2016

(30) Foreign Application Priority Data

Aug. 29, 2014 (JP) .................................. 2014-176127

(51) Int. Cl.
*H03K 19/00* (2006.01)

(52) U.S. Cl.
CPC .................................. *H03K 19/0002* (2013.01)

(58) Field of Classification Search
CPC ...... G06N 99/00; G06N 99/002; G06F 17/18; G06F 17/5009; H01L 29/02; H01L 29/122; H01L 29/127; H01L 39/145; H01L 39/146
USPC .......... 326/1–7, 56; 257/9, 20, 29.07, 29.071, 257/428
See application file for complete search history.

(56) References Cited

U.S. PATENT DOCUMENTS

| 8,190,553 B2 * | 5/2012 | Routt ..................... B82Y 10/00 706/62 |
| 8,421,053 B2 | 4/2013 | Bunyk et al. |
| 2014/0046626 A1 | 2/2014 | Yamamoto et al. |

FOREIGN PATENT DOCUMENTS

| JP | 2011524026 A | 8/2011 |
| JP | 2012-217518 A | 11/2012 |
| WO | 2012118064 A1 | 9/2012 |

* cited by examiner

*Primary Examiner* — Jimmy Vu
(74) *Attorney, Agent, or Firm* — Volpe and Koenig, P.C.

(57) ABSTRACT

An object of the present invention is to realize an example of configuration that approximately represents a state of quantum spin in a semiconductor device where components as a basic configuration unit are arrayed so as to search a ground state of Ising model. There is disclosed a semiconductor device provided with plural units each of which is equipped with a first memory cell that stores a value which represents one spin of the Ising model by three or more states, a second memory cell that stores an interaction coefficient showing interaction from another spin which exerts interaction on the one spin and a logical circuit that determines the next state of the one spin on the basis of a function having a value which represents a state of the other spin and the interaction coefficient as a constant or a variable.

10 Claims, 31 Drawing Sheets

$V' = \{A, B\}$
$V' \setminus V = \{C, D\}$
$w(V') = -2$

FIG. 12

MEMORY MAP 2000

| ADDRESS | BIT0 | BIT1 | BIT2 | BIT3 | BIT4 | BIT5 |
|---|---|---|---|---|---|---|
| 0 | N | N | N | N | N | N |
| 1 | IS0 | IS0 | IS0 | IS0 | IS0 | IS0 |
| 2 | IS1 | IS1 | IS1 | IS1 | IS1 | IS1 |
| 3 | IU0 | IU0 | IU0 | IU0 | IU0 | IU0 |
| 4 | IU1 | IU1 | IU1 | IU1 | IU1 | IU1 |
| 5 | IL0 | IL0 | IL0 | IL0 | IL0 | IL0 |
| 6 | IL1 (N000) | IL1 (N001) | IL1 (N100) | IL1 (N101) | IL1 (N200) | IL1 (N201) |
| 7 | IR0 | IR0 | IR0 | IR0 | IR0 | IR0 |
| 8 | IR1 | IR1 | IR1 | IR1 | IR1 | IR1 |
| 9 | ID0 | ID0 | ID0 | ID0 | ID0 | ID0 |
| 10 | ID1 | ID1 | ID1 | ID1 | ID1 | ID1 |
| 11 | IF0 | IF0 | IF0 | IF0 | IF0 | IF0 |
| 12 | IF1 | IF1 | IF1 | IF1 | IF1 | IF1 |
| 13 | N | N | N | N | N | N |
| 14 | IS0 | IS0 | IS0 | IS0 | IS0 | IS0 |
| 15 | IS1 | IS1 | IS1 | IS1 | IS1 | IS1 |
| 16 | IU0 | IU0 | IU0 | IU0 | IU0 | IU0 |
| 17 | IU1 | IU1 | IU1 | IU1 | IU1 | IU1 |
| 18 | IL0 | IL0 | IL0 | IL0 | IL0 | IL0 |
| 19 | IL1 (N010) | IL1 (N011) | IL1 (N110) | IL1 (N111) | IL1 (N210) | IL1 (N211) |
| 20 | IR0 | IR0 | IR0 | IR0 | IR0 | IR0 |
| 21 | IR1 | IR1 | IR1 | IR1 | IR1 | IR1 |
| 22 | ID0 | ID0 | ID0 | ID0 | ID0 | ID0 |
| 23 | ID1 | ID1 | ID1 | ID1 | ID1 | ID1 |
| 24 | IF0 | IF0 | IF0 | IF0 | IF0 | IF0 |
| 25 | IF1 | IF1 | IF1 | IF1 | IF1 | IF1 |
| 26 | N | N | N | N | N | N |
| 27 | IS0 | IS0 | IS0 | IS0 | IS0 | IS0 |
| 28 | IS1 | IS1 | IS1 | IS1 | IS1 | IS1 |
| 29 | IU0 | IU0 | IU0 | IU0 | IU0 | IU0 |
| 30 | IU1 | IU1 | IU1 | IU1 | IU1 | IU1 |
| 31 | IL0 | IL0 | IL0 | IL0 | IL0 | IL0 |
| 32 | IL1 (N020) | IL1 (N021) | IL1 (N120) | IL1 (N121) | IL1 (N220) | IL1 (N221) |
| 33 | IR0 | IR0 | IR0 | IR0 | IR0 | IR0 |
| 34 | IR1 | IR1 | IR1 | IR1 | IR1 | IR1 |
| 35 | ID0 | ID0 | ID0 | ID0 | ID0 | ID0 |
| 36 | ID1 | ID1 | ID1 | ID1 | ID1 | ID1 |
| 37 | IF0 | IF0 | IF0 | IF0 | IF0 | IF0 |
| 38 | IF1 | IF1 | IF1 | IF1 | IF1 | IF1 |

LEGEND

- $V_i$     IDENTIFIER OF SPIN
- $J_{ij}$     INTERACTION COEFFICIENT (ith SPIN->jth SPIN)
- $h_i$     EXTERNAL MAGNETIC FIELD COEFFICIENT (ith SPIN)

FIG. 18

```
                    ┌─ 1800: PROBLEM DATA
                  ┌─┘
                  │ I  v1  v2  J12
                  │ I  v2  v1  J21
                  │ I  v1  v3  J13
                  │ I  v1  v2  J12
                  │ E  v1  h1
                  │ E  v2  h2
                  └────────────────┘
```

LEGEND

| | |
|---|---|
| I | IDENTIFIER SHOWING INTERACTION COEFFICIENT DEFINITION UNIT |
| E | IDENTIFIER SHOWING EXTERNAL MAGNETIC FIELD COEFFICIENT DEFINITION UNIT |
| $V_i$ | IDENTIFIER OF SPIN |
| $J_{ij}$ | INTERACTION COEFFICIENT (ith SPIN->jth SPIN) |
| $H_i$ | EXTERNAL MAGNETIC FIELD COEFFICIENT (ith SPIN) |

SOLUTION 1900

| SPIN | VALUE OF SPIN |
|------|---------------|
| v1   | σ1            |
| v2   | σ2            |
| v3   | σ3            |

SOLUTION DATA 1920

σ1  σ2  σ3

LEGEND vi      IDENTIFIER OF SPIN

σi      VALUE OF ith SPIN (BINARY OF -1/+1)

SEMICONDUCTOR DEVICE

CLAIM OF PRIORITY

The present application claims priority from Japanese application serial no. JP2014-176127, filed on Aug. 29, 2014, the content of which is hereby incorporated by reference into this application.

FIELD OF THE INVENTION

The present invention relates to a device that makes computation for an interaction model.

BACKGROUND OF THE INVENTION

Currently, a mainstream of computer architecture lies in Neumann type computer. The basic operation of the Neumann type architecture is to sequentially execute instruction strings. Enhancement in the performance of a computer has mainly depended upon the enhancement of a clock frequency. However, recently, in place of the clock frequency that reaches the peak, a method of realizing the enhancement of performance with parallel processing by multicoring is a mainstream.

In the parallel processing by multicoring, performance is enhanced by finding a location where parallel execution is possible in serial instruction strings (extracting parallelism) and executing parallel processing. However, it is not easy to extract parallelism from a program in which serial algorithm is written in the form of instruction strings.

In view of such a situation, to enhance the performance of a computer hereafter, essential conversion to parallel information processing without being based upon the execution of serial instruction strings as heretofore is required. A method of describing a subject suitable for realizing essential parallel information processing is then required in place of the past method of describing a subject by serial instruction strings.

Various physical phenomena and various social phenomena can be represented by an interaction model. The interaction model means a model defined by plural entities or plural nodes that configure the model, interaction between the entities and further, bias for every entity if necessary. In physics and social science, although various models are proposed, any can be interpreted as one configuration of the interaction model. Besides, for a characteristic of the interaction model, it can be given that an effect among entities is limited to interaction between two entities. For example, the dynamics of planets in cosmic space can also be interpreted as one type of the interaction model because interaction by universal gravitation exists between entities called planets. However, an effect among the planets is not limited to that between two planets. Three or more planets have an effect upon one another, and show complex behavior (a problem respectively called a three-body problem and a many-body problem). For one example of the interaction model, Ising model can be given. The Ising model means a model of statistical mechanics for explaining the behavior of a magnetic body and is used for the research of the magnetic body. The Ising model is defined as interaction between sites (spins that take two values of +1 and −1). It is known that search by topology for a ground state of the Ising model to be a nonplanar graph is an NP-hard problem. The Ising model may be able to realize information processing utilizing essential parallelism because the Ising model represents the problem by interaction coefficients that spread in space.

As the search of the ground state of the Ising model is the NP-hard problem as described above, it is difficult in terms of computation time to acquire the solution by the Neumann type computer. Algorithm for accelerating using heuristics is also proposed while a method is proposed in which the ground state of the Ising model is computed at high speed by not the Neumann type computer but an analog computer that computes more directly utilizing physical phenomena.

For such a device, a device disclosed in WO 2012/118064 for example can be given. In such a device, a degree of parallelism corresponding to a subject to be solved is required. In the case of the Ising model, elements that realize spin and interaction corresponding to the number of spins in the Ising model which should search the ground state are required. In the device disclosed in the WO 2012/118064 for example, spin and a laser are made to correspond and lasers of the number proportional to the number of spins are required. That is, the height of scalability that can realize multiple elements is required.

Besides, in the world of biology, a neural network that models a brain is one example of the interaction model. The neural network is based upon an artificial neuron that models a neuron and artificial neurons have interaction called connection by a synapse. Moreover, bias may also be applied every neuron. In the world of social science, considering communication between persons for example will make it easy to understand that interaction made by language and communication exists between entities called a person. In addition, it can also be imagined that bias exists individually in each person. Therefore, research to clarify a characteristic of human communication in the Ising model common in the terms of the interaction model and others is also done (for example, refer to JP-A No. 2012-217518).

Further, as disclosed in Japanese Unexamined Patent Application Publication No. 2011-524026, an attempt to search the ground state of the Ising model utilizing quantum mechanical effect in a superconducting device is also made. The quantum mechanical effect means to utilize a so-called superposed state, to utilize the superposition of spin states, and to try to enhance the performance of convergence.

However, from a viewpoint of scalability, an approach different from the abovementioned device is demanded. That is, to realize the more number of spins, a large number of lasers are required to be arranged and a superconducting device that requires advanced cooling technique has a limit. A method of acquiring great scalability more simply is required. It is a semiconductor device (a semiconductor integrated circuit) that is the best in scalability in the current packaging technique. In the semiconductor integrated circuit, circuits are formed over a semiconductor substrate made of silicon and others by a method similar to printing technique called photolithography. Besides, the size of elements and wiring which can be respectively formed on/over the semiconductor substrate is reduced year by year (it is called the microfabrication of a semiconductor device), and a circuit scale which can be packaged in the same area is growing larger year by year.

The high scalability of the semiconductor integrated circuit has supported the enhancement of the performance of the Neumann type computer. However, in the abovementioned new type of computer, a realizable embodiment as a semiconductor device having high scalability will be also demanded.

SUMMARY OF THE INVENTION

An object of the present invention is to realize configuration that makes the computation of an interaction model in a solid-state device to which the technique of a semiconductor device is applied and which is produced.

One aspect of the present invention for settling the above-mentioned problem is provided as a semiconductor device. This device is provided with plural units each of which is equipped with a memory cell that stores multiple value (ternary or more) data for storing a value of a target entity of an interaction model, a memory cell that stores an interaction coefficient from an adjacent entity which exerts interaction on the target entity and a logical circuit that determines the next state of the target entity on the basis of a function having the value of the entity and the interaction coefficient in a system configured by the target entity and the adjacent entity as a constant or a variable.

Another aspect of the present invention is provided with plural units each of which is equipped with a memory cell that stores a value of a target entity of an interaction model, a memory cell that stores an interaction coefficient from an adjacent entity which exerts interaction on the target entity, and a logical circuit that determines the next state of the target entity on the basis of a function having the value of the entity and the interaction coefficient in a system configured by the target entity, and the adjacent entity as a constant or a variable, and is provided with interfaces that vary a value of a coefficient used for functional calculus in the logical circuit in common in the plural units, and is provided with an interface that varies a value of a coefficient used for functional calculus in the logical circuit in common in the plural units.

Besides, another aspect of the present invention is an information processing method of computing an entity array (or its approximate solution) which is solution as a desired value having a value of a function of an interaction model expressed by the function having a value of the entity and an interaction coefficient of interaction in a system configured by the target entity and an adjacent entity as a constant or a variable by an information processor including an input device, an output device, a storage and a processing unit. In this method, +1, −1 as the value of the entity in the entity array and a digitized multiple value as an intermediate value of these are used in computation. In this case, the value of the entity in the system configured by the target entity and the adjacent entity may also be a variable as a whole, a part may also be fixed (a constant), and the other may also be a variable. Moreover, as for the interaction coefficient, the whole may also be a variable or a constant, a part may also be a constant and the other may also be a variable.

In the solid-state device to which the technique of the semiconductor device is applied and which is produced, the configuration that searches the solution having the value of the function expressing the interaction model as the desired value can be realized.

A problem, configuration and effect except the abovementioned those will be clarified by the description of the following embodiment.

BRIEF DESCRIPTION OF THE DRAWINGS

FIG. 12 is a plan view showing one example of a memory map of the Ising chip;

FIG. 18 is a table showing the configuration of problem data of the Ising chip;

DETAILED DESCRIPTION OF THE PREFERRED EMBODIMENTS

Figure 1:
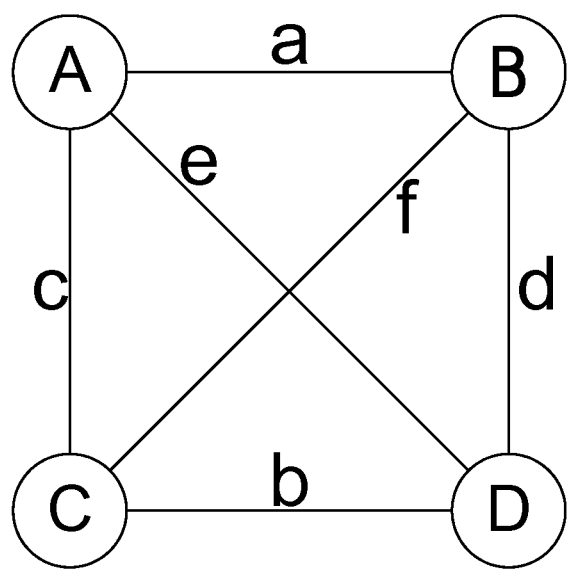
FIG. 1 is a graph for explaining one example of a graph problem to be solved by Ising chip.

Ising model can be given for an example of a representative interaction model in the world of physics. The Ising model is based upon spin that takes two states of +1 and −1 (or upper and lower) and is defined by an interaction coefficient that determines interaction between two spins and an external magnetic field coefficient which is bias to individual spin. This embodiment will be described using Ising chip which is a device that can manage the Ising model for an example for means for making the computation of the interaction model. However, the present invention provides technique for computing a value of a variable in a function at high speed when a value of the function expressing a general interaction model is converged on a desired value and application is not limited to the Ising model. Besides, although the device in the embodiment is called the Ising chip for convenience, the device in the embodiment may also be applied to a model except the Ising model.

One example in this embodiment is provided as a semiconductor device. This semiconductor device has configuration for approximately representing a spin state of a quantum and is provided with plural spin units each of which is equipped with a memory cell that stores multiple value (ternary or more) data for storing a value of target spin of the Ising model, a memory cell that stores an interaction coefficient from adjacent spin that exerts interaction on the target spin, a memory cell that stores an eternal magnetic field coefficient of the target spin and a logical circuit that determines the next state of the target spin on the basis of an energy function of a system configured by the target spin and the adjacent spin. The plural spin units form array structure.

It is desirable that the memory cell that stores a value of the target spin can express at least three states of a state of +1, a state of −1 and a state of neither +1 nor −1 respectively as a value of the spin. For the state of neither +1 nor −1, a state of 0 can be given.

Another example of this embodiment is based upon a semiconductor device provided with plural spin units each of which is equipped with a memory cell that stores a value of target spin in Ising model, a memory cell that stores an interaction coefficient from adjacent spin that exerts interaction on the target spin, a memory cell that stores an external magnetic field coefficient of the target spin, and a logical circuit that determines the next state of the target spin on the basis of an energy function of a system configured by the target spin and the adjacent spin. This device is provided with an interface that varies a value of a coefficient used for computing the energy function in the logical circuit in common in the plural spin units. When a different coefficient is used in the plural spin units, a memory cell that stores a transverse magnetic field coefficient is prepared in each spin unit and a signal for weighting a value of the transverse magnetic field coefficient in the memory cell may also be supplied from the interface.

Besides, another embodiment of the present invention is based upon an information processing method or an information processor of computing that computes a ground state which is a spin array that makes the energy of the Ising model least or its approximate solution by the information processor configured by an input device, an output device, a storage and a processing unit. In this method, +1, −1 as a value of spin in a spin array and a digitized multiple value as an intermediate value of these are used in computation.

In the abovementioned method or processor, it is desirable that a transverse magnetic field coefficient is also used in computation and the transverse magnetic field coefficient is controlled by the interface common to the plural spin units.

In the abovementioned method or processor, it is desirable that a random value is added to the external magnetic field coefficient in computation. The random value is controlled by the interface common to the plural spin units.

In the abovementioned method or processor, it is desirable that when a value of the external magnetic field coefficient is 0 in computation, a random value is set as the external magnetic field coefficient in place of the value of 0 and processing for returning to 0 at predetermined timing is adopted.

Referring to the drawings, the embodiments of the present invention will be described below. In a former half, the embodiment of the basic configuration of Ising chip that searches a ground state of the interaction model will be described. In a latter half, the embodiment of the application of the Ising chip will be described.

However, the present invention should not be interpreted by only the contents of the following embodiments. It will be readily understood by those in the art that the concrete configuration can be modified in a scope that does not deviate from a concept and a purpose of the present invention.

In the configuration described below of the present invention, the same reference numeral is used for the same part or a part having the similar function in common in the different drawings and duplicate description is omitted.

A notation such as first, second and third in this specification is added to identify a component and does not necessarily limit a number or order.

A position, size, a shape, a range and others in each configuration shown in the drawings may not represent an actual position, actual size, an actual shape and an actual range to facilitate the understanding of the present invention. Therefore, the present invention is not necessarily limited to the position, the size, the shape, the range and others disclosed in the drawings and others.

A publication, patents and patent applications cited in this specification configure a part of the description of this specification as they are.

(1) Basic Configuration of Ising Chip

Ising chip which is an embodiment of the device that searches a ground state of the interaction model in the present invention will be described below. The Ising chip is provided with plural units each of which is equipped with first to seventh binary or multiple value (ternary or more) memory cells. Data in the seventh memory cells of the other first to fifth units are input to a certain one unit (a target unit), operation is performed on the basis of the five data from the other units and data in the first to sixth memory cells of the target unit, and data in the seventh memory cell of the target unit is rewritten according to a result of the operation. At this time, the Ising chip controls so that the data in the seventh memory cell of the corresponding unit and the data in the seventh memory cells of the other first to fifth units are not simultaneously rewritten. Connection relation between data in the memory cell and the unit is provided for the Ising chip having the abovementioned configuration according to topology of the Ising model.

(1-1) Conversion of Problem to be Solved to Ground State Search Problem of Ising Model The Ising model is a statistical mechanical model for explaining the behavior of a magnetic body. The Ising model is typically defined by spin that takes two values of +1 and −1 (or 0 and 1 or upper and lower), an interaction coefficient denoting spin-spin interaction and an external magnetic field coefficient accompanying every spin.

The Ising model can compute energy at that time on the basis of values of a spin array, an interaction coefficient and an external magnetic field coefficient. An energy function $E(\sigma)$ of the Ising model is generally expressed by the following expression (Mathematical expression 1). "$\sigma_i$" and "$\sigma_j$" are values of "i"th and "j"th spins, $J_{i,j}$ is an interaction coefficient between the "i"th and "j"th spins, $h_i$ is an external magnetic field coefficient for the "i"th spin, <i, j> is combination of adjacent two sites, and "σ" expresses an array of the spins.

$$E(\sigma) = -\sum_{(i,j)} J_{i,j}\sigma_i\sigma_j - \sum_i h_i\sigma_i \quad \text{[Mathematical expression 1]}$$

The search of a ground state of the Ising model is an optimization problem that searches an array of spin that minimizes the energy function of the Ising model. For example, a problem having no relation with a magnetic body at a glance such as coefficientization and a traveling salesman problem can be converted to the Ising model. The ground state of the Ising model acquired by the conversion corresponds to the solution of the original problem. Hereby, it can be said that a device that can search the ground state of the Ising model is a computer that can be utilized for general-purpose application.

In this embodiment, to explain from a problem to be solved to the setting of the Ising chip through, a maximum cut problem of a graph will be taken up as an example.

FIG. 1 is a graph for explaining one example of a graph problem for the Ising chip to solve.

First, the meaning of the graph will be described. The graph G=(V, E) shown in FIG. 1 is configured by a set of vertexes V={A, B, C, D} and a set of sides E={a, b, c, d, e, f}. Each side has a weighting coefficient and when a, b, c, d, e, f are written, they shall express their weighting coefficients.

Figure 2:
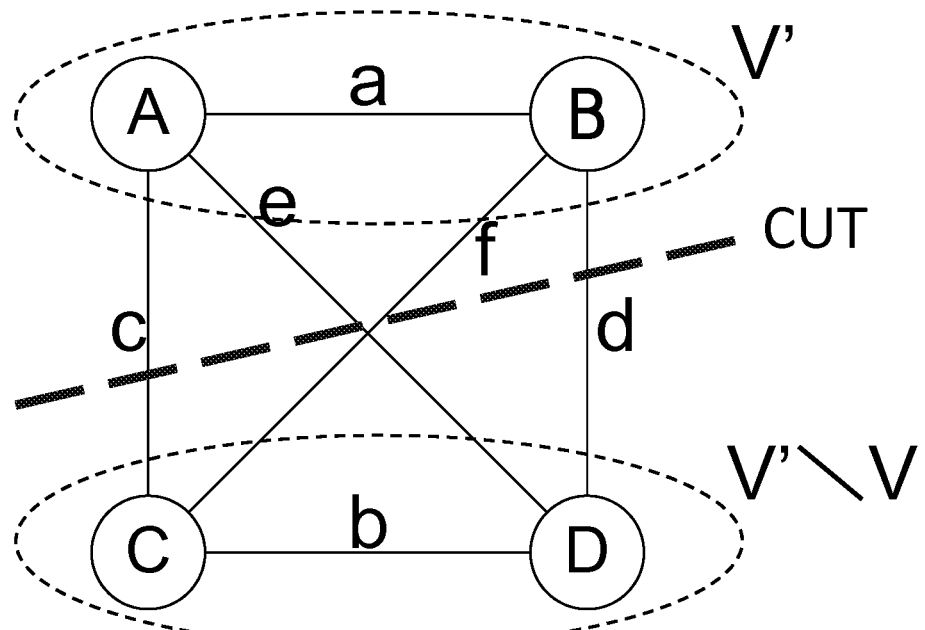
FIG. 2 is a graph for explaining a concept of a cut in the example of the graph problem to be solved by the Ising chip.

As shown in FIG. 2, it is called a cut that vertexes V in this graph are divided into two subsets V' and V'\V. V'\V expresses the subset acquired by removing V' from V. The sides (c, d, e, f in FIG. 2) across the divided V' and V'\V are edges across the cut or cut edges. The total number of cut edges in the case of a graph not weighted and the total weight of the cut edges in the case of the weighted graph as in FIG. 2 are called the size of the cut. In the example shown in FIG. 2, the size of the cut is c+d+e+f. Although FIGS. 1 and 2 are examples of an undirected graph, they can also be extended to a directed graph.

The maximum cut problem means to search a cut that maximizes the size of the cut when the graph G=(V, E) is given. In other words, it may also be said that the set V of the vertexes is grouped into V' and V'\V so that the size of the cut is maximized.

Figure 3:
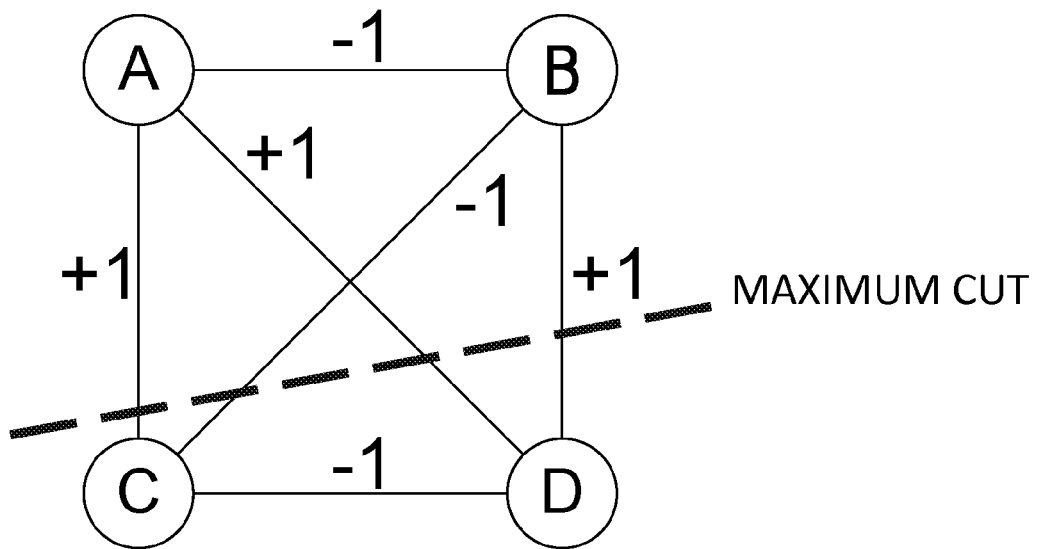
FIG. 3 is a graph for explaining a maximum cut in the example of the graph problem to be solved by the Ising chip.

FIG. 3 shows a concrete example of the maximum cut problem. In this example, the size of a cut is "w (V')=2" in cutting so that vertexes V are divided into V'={A, B} and V'\V={C, D} and the cut is a maximum cut in this graph.

Referring to FIG. 2 again, relation between the cut of the graph and the Ising model will be described below. In the graph shown in FIG. 2, the size w (V') of the cut is c+d+e+f. When the graph shown in FIG. 2 is regarded as the Ising model, the weight of the sides E (={a, b, c, d, e, f}) is equivalent to an interaction coefficient of the Ising model. The vertexes V (={A, B, C, D}) are equivalent to spin that has a state of two values of +1 and −1 in the Ising model. In this case, the vertexes that belong to the cut vertexes V' shall be spin of +1 and the vertexes that belong to V'\V shall be spin of −1. That is, A=+1, B=+1, C=−1, and D=−1. The energy of the Ising model at this time is "−(a+b−c−d−e−f)=−a−b+c+d+e+f" when it is computed according to the energy function shown in (Mathematical expression 1). As the size w (V') of the cut is c+d+e+f, this energy function can be expressed as shown in Mathematical expression 2.

$$E(\sigma) = -\left(\sum_{(i,j)} J_{i,j} - 2w(V')\right) \quad \text{[Mathematical expression 2]}$$

When the energy function is concretely computed in the example shown in FIG. 2, it will be verified that −((a+b+c+d+e+f)−2(c+d+e+f))=−(a+b−c−d−e−f). It is known that if the size w (V') of the cut is maximized when (Mathematical expression 2) is referred, the energy E (σ) also grows larger. That is, when the size of the cut is maximized, the energy of the Ising model is maximized. Conversely, when the size of the cut is minimized, the energy of the Ising model is minimized. That is, the search of the ground state of the Ising model corresponds to the acquisition of the minimum cut. Then, the minimum cut is acquired by all inverting signs of weight in the maximum cut problem.

Figure 4:
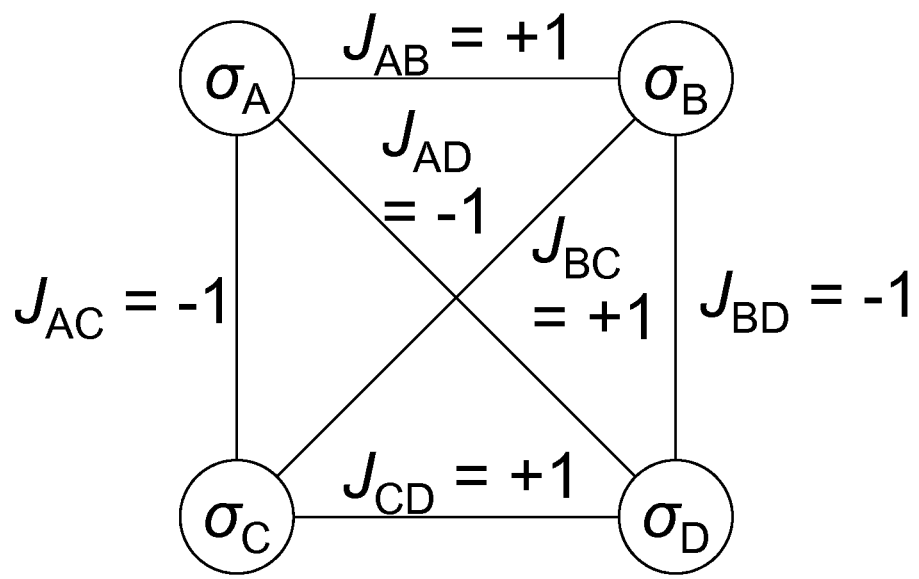
FIG. 4 is a graph for explaining one example of an interaction model corresponding to the graph problem.

FIG. 4 shows an example that the maximum cut problem shown in FIG. 3 is converted to the ground state search problem of the Ising model. Interaction coefficients JAB, JAC, JAD, JBC, JBD, JCD of each side shown in FIG. 4 are acquired by inverting the signs of weight shown in FIG. 3. This corresponds to the abovementioned conversion from the maximum cut problem to the minimum cut problem.

Figure 5:
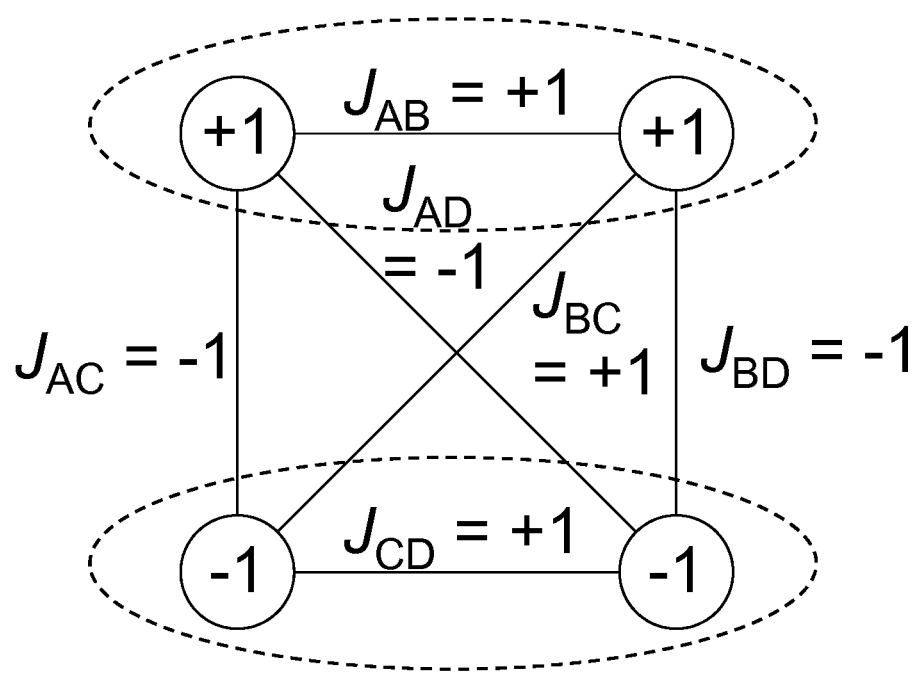
FIG. 5 is a graph for explaining solution in the example of the interaction model corresponding to the graph problem.

FIG. 5 shows spins σA, σB, σC, σD determined so that energy is minimum to search the ground state of the Ising model shown in FIG. 4. In an example shown in FIG. 5, σA=+1, σB=+1, σC=−1, and σD=−1. However, in the Ising model, since inverted states of all spins also have the same energy, σA of −1, σB of −1, σC of +1 and σD of +1 are also in the ground state. In the example shown in FIG. 5, at vertexes that belong to a cut V', a value of spin is +1 and at vertexes that belong to V'\V, a value of spin is −1. As described above, the maximum cut or the minimum cut can be realized by searching the ground state of the Ising model and grouping the vertexes at the value of spin.

(1-2) Configuration of Ising Chip

Next, the Ising chip which is a device that realizes the search of the ground state of the Ising model shown in FIG. 4 and its control method will be described. In this case, an example of the device that realizes the search of the ground state of the Ising model of a three-dimensional grid is shown. However, the present invention is not limited to the Ising model of the three-dimensional grid and can be applied to arbitrary topology and the arbitrary number of spins.

Figure 6:
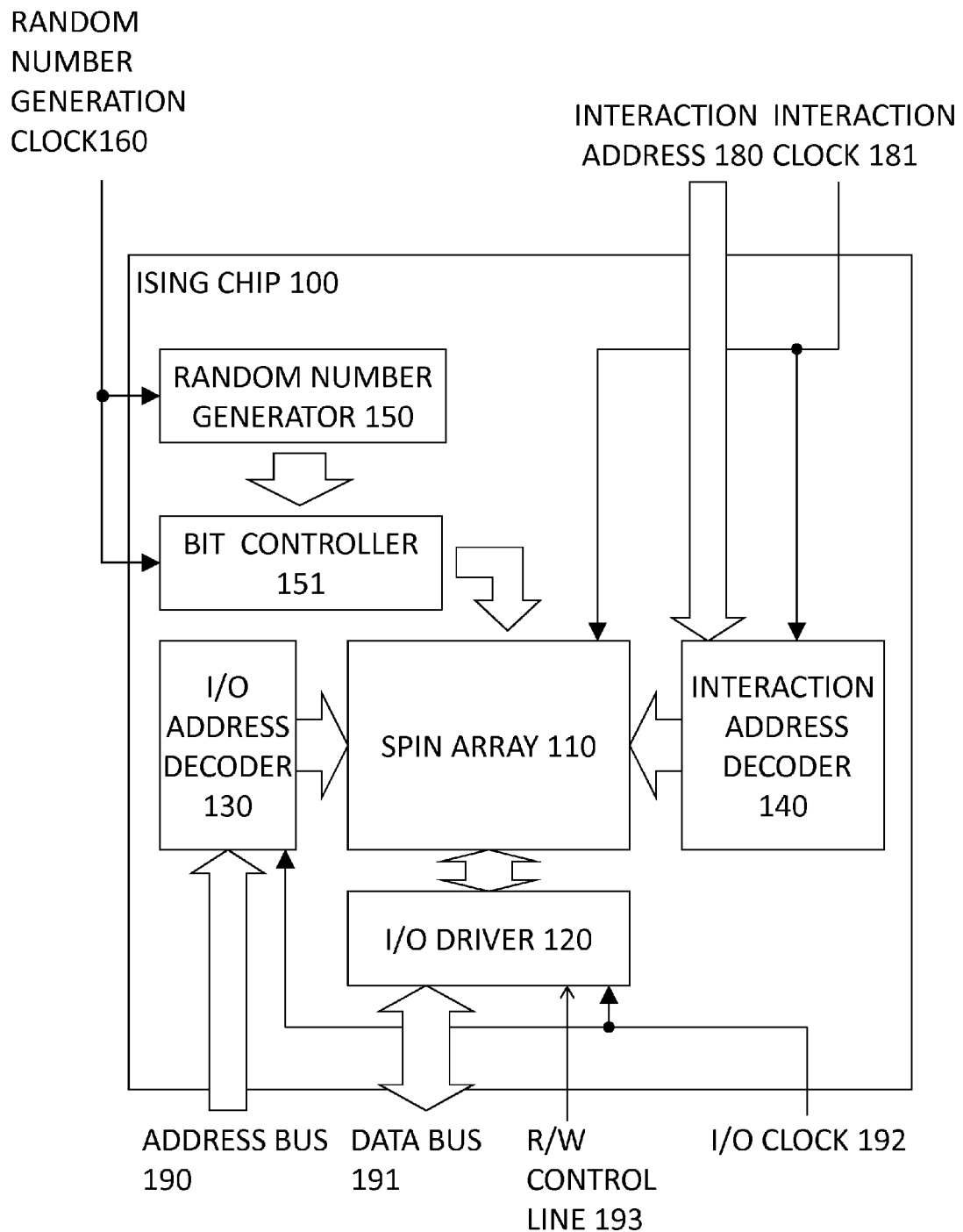
FIG. 6 is a block diagram for explaining the configuration of the Ising chip equivalent to one embodiment of the present invention.

FIG. 6 shows an example of the configuration of the Ising chip 100 in this embodiment. The Ising chip 100 is configured by a spin array 110, an I/O driver 120, an I/O address decoder 130 and an interaction address decoder 140.

In this embodiment, it is supposed that the Ising chip 100 is packaged as a CMOS integrated circuit currently used widely. The Ising chip can be realized by another solid-state device as well. In this embodiment, the spin array 110 is configured by a semiconductor memory array. A type of the memory is not a question. An example using a static random access memory (SRAM) that can be operated at high speed will be described below. The Ising chip 100 can be driven by an SRAM convertible interface for reading/writing from/to the spin array 110. The SRAM convertible interface includes an address bus 190, a data bus 191, a R/W control line 193 and an I/O clock 192.

In the Ising chip 100, spin $\sigma_i$, an interaction coefficient $J_{i,j}$ and an external magnetic field coefficient $h_i$ respectively of the Ising model are all expressed by information stored in memory cells for the spin array 110. The SRAM convertible interface reads/writes these values from/to the memory cells for the spin array.

To set the Ising model the ground state of which is to be searched in the Ising chip 100, an address is allocated to the memory cell. Besides, the spin $\sigma_i$ in the spin array 110, the interaction coefficient $J_{i,j}$ and the external magnetic field coefficient $h_i$ are made to correspond to the address of the memory cell. A method of reading/writing information from/to a memory cell of an arbitrary address is similar to technique for controlling a well-known semiconductor memory.

The address bus 190, the data bus 191 and the R/W control line 193 which respectively configure the SRAM convertible interface are operated in synchronization with a clock signal input to the I/O clock 192. However, in the present invention, the interface is not required to be synchronous and an asynchronous interface may also be used. In this embodiment, the description is made on a premise that the interface is synchronous.

The Ising chip 100 realizes spin-spin interaction in the inside of the spin array 110 to search the ground state. In this case, the interaction means a series of processing that a value of the memory cell for the spin array 110 is read, energy is computed on the basis of the read value, a value of spin the energy of which is small is determined and the determined value of the spin is written to the memory cell.

It is an interaction control interface that controls the interaction from the outside, concretely, an address that specifies a group of spins that makes interaction is input in the form of an interaction address 180, and interaction is performed in synchronization with a clock signal input to an interaction clock 181.

The interaction is not necessarily required to be realized in a clock synchronous circuit and may also be realized in an asynchronous circuit. In this case, a role of the interaction clock 181 is not the input of a clock signal but shall be an enable signal that permits the execution of the interaction. The interaction control interface is also not necessarily required to be synchronous and may also be an asynchronous interface. However, in this embodiment, description is made on a premise that a synchronous interface is used and interaction is performed in synchronization with the interaction clock 181.

A random number generator 150, a bit controller 151 and a random number generation clock 160 respectively shown in FIG. 6 will be described later. Besides, the details of an interaction address decoder 140 will be also described later.

(1-3) Configuration of Information Processor Provided with Ising Chip

An information processor realizes information processing using one or plural Ising chips 100, however, the information processor is required to control the abovementioned SRAM interface.

Figure 7:
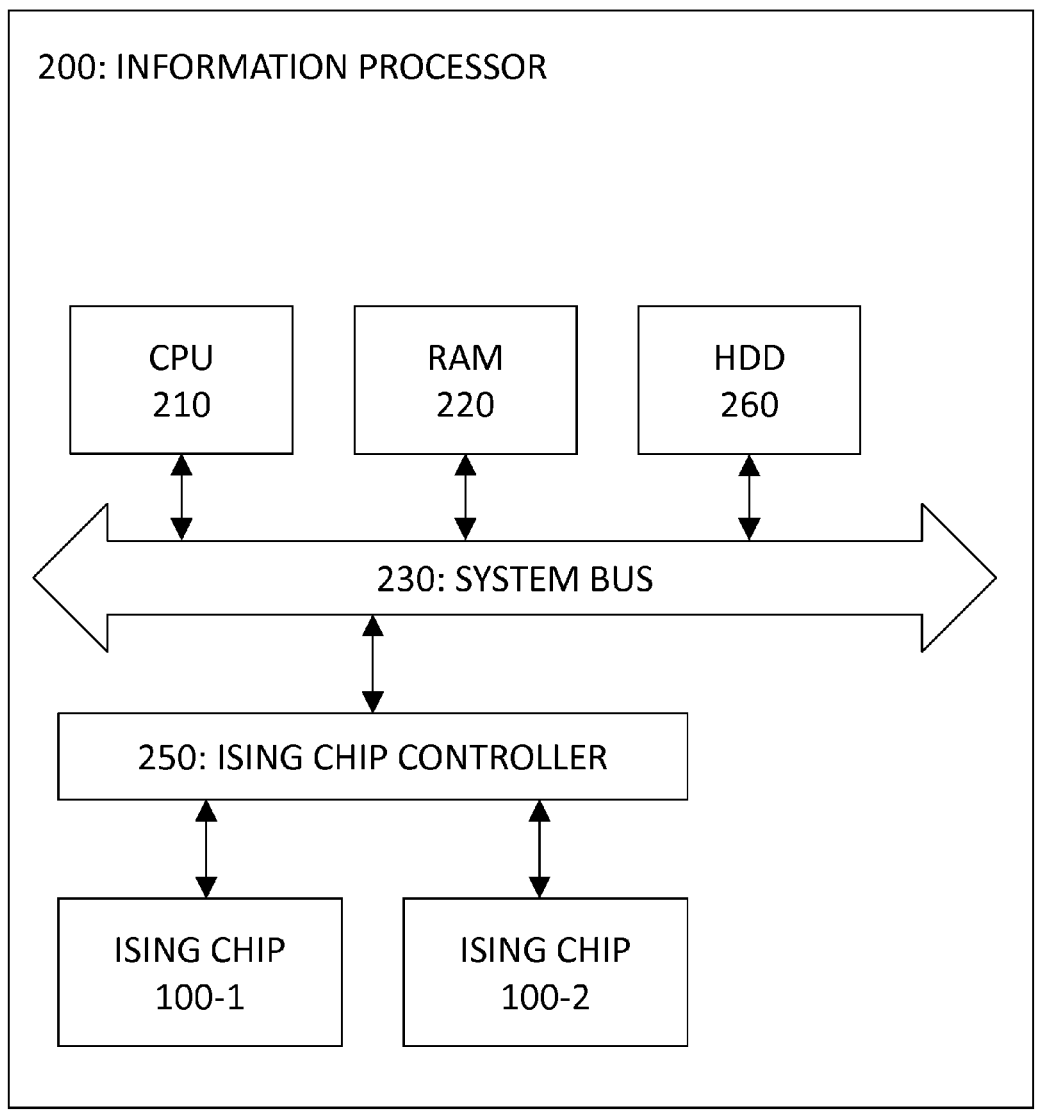
FIG. 7 is a block diagram for explaining the configuration of an information processor provided with the Ising chip equivalent to one embodiment of the present invention.

FIG. 7 shows one example of the configuration of the information processor that controls the Ising chip shown in FIG. 6. In this example, the Ising chip 100 is utilized for a part of the information processor 200.

For a typical example of the information processor 200, a currently generally used personal computer in which an accelerator configured by the Ising chip 100 is installed can be given. The information processor 200 is provided with a central processing unit (CPU) 210, a temporary memory (RAM) 220 and a storage (HDD) 260 and these are connected via a system bus 230.

In addition, an Ising chip controller 250 is connected to the system bus 230 and one or plural Ising chips (in the example shown in FIG. 7, two Ising chips 100-1, 100-2 and hereinafter, when the two Ising chips are not especially required to be distinguished, they are merely called the Ising chip 100) are connected to the Ising chip controller 250. The Ising chip controller 250 and the Ising chip 100 are equivalent to the accelerator and for the accelerator, an expansion card used by inserting into an interface for peripheral expansion such as PCI Express (a trademark) may also be used.

The Ising chip controller 250 converts a protocol of the system bus 230 (for example, PCI Express (registered trademark) and QPI) in accordance with the interface of the Ising chip 100. Software operated in the CPU 210 of the information processor 200 can control the Ising chip 100 via the Ising chip controller 250 by generally reading/writing data from/to a specific address (so-called memory mapped I/O (MMIO)).

When the Ising chip 100 is made to solve a problem in the information processor 200 shown in FIG. 7, problem data is stored in the HDD 260 for example. Besides, a program for converting the problem data to the ground state search problem of the Ising model and a program for controlling the Ising chip 100 are stored in the RAM 220 and are executed by the CPU 210.

(1-4) Structure of Ising Model

The spin array 110 in the Ising chip 100 corresponds to the Ising model and simulates it. The spin array 110 has one spin (target spin), an interaction coefficient accompanying it and a spin unit that holds an external magnetic field coefficient and realizes a ground state search process as a basic configuration unit.

Figure 8:
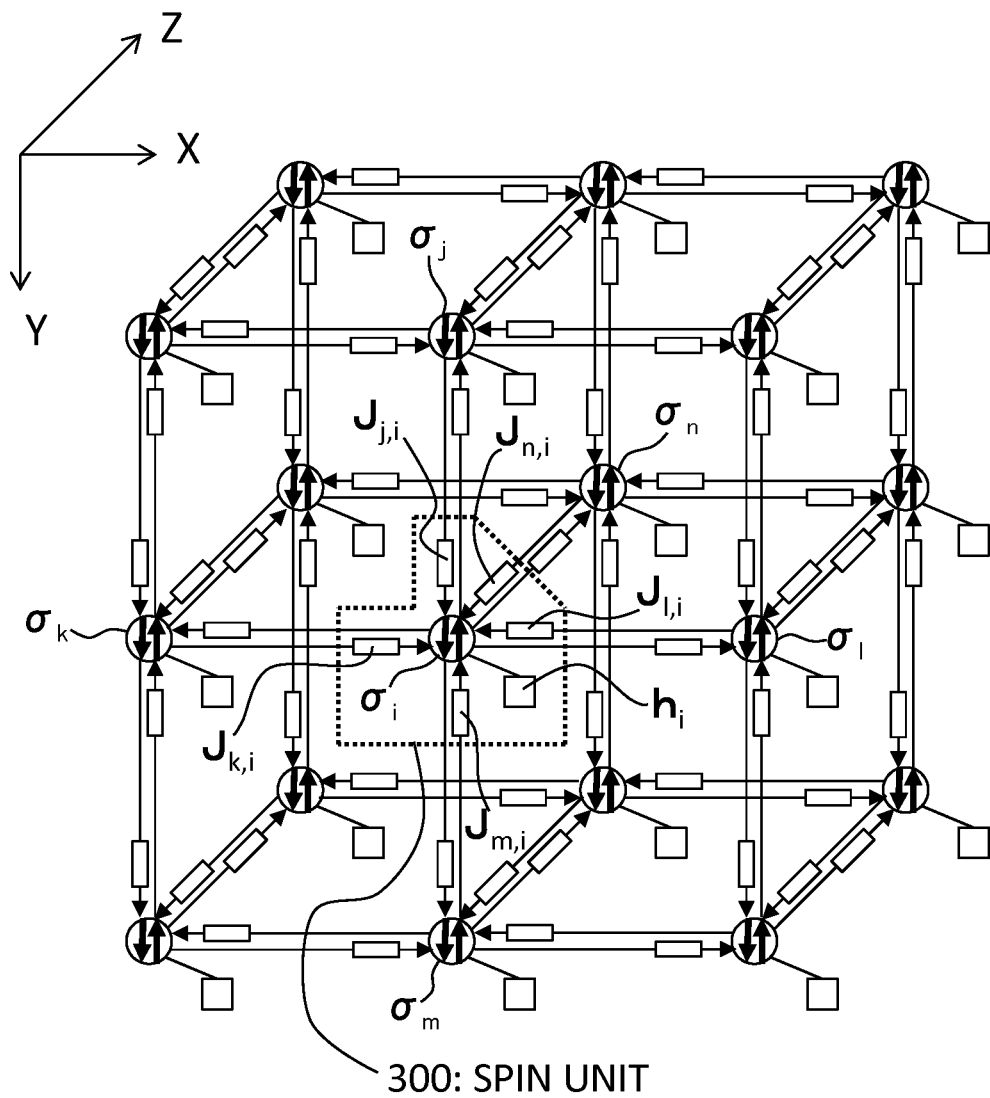
FIG. 8 is a perspective view for explaining one example of the configuration of a three-dimensional grid-like spin array.

FIG. 8 shows an example in which the Ising model having three-dimensional grid-like topology is configured by arranging plural spin units 300. In the example shown in FIG. 8, a three-dimensional grid having the size of 3 (in an x-axis direction)×3 (in a y-axis direction)×2 (in a z-axis direction) is shown.

For the definition of coordinate axes, a rightward direction in the drawing is set as the x-axis, a downward direction in the drawing is set as the y-axis, and a direction toward the depth in the drawing is set as the z-axis as shown in the drawing (in the following drawings, also similar). These coordinate axes are necessary only conveniently to explain the embodiment and have no relation with the present invention. When topology except the three-dimensional grid, for example, tree-like topology is utilized, topology is expressed by the number of stages of a tree separately from coordinate axes. In the three-dimensional grid-like topology shown in FIG. 8, when spin-spin interaction is interpreted as a graph, spins (vertexes) of five degrees at the maximum are required. When connection for the external magnetic field coefficient is also considered, six degrees at the maximum are required.

Values of adjacent spins $\sigma j$, $\sigma k$, $\sigma l$, $\sigma m$, $\sigma n$ (in the case of five adjacent spins) are input to one spin unit 300 shown in FIG. 8. Besides, the spin unit 300 is provided with memory cells that hold Jj,i, Jk,i, Jl,i, Jm,i, Jn,i (interaction coefficients with the adjacent five spins) which are interaction coefficients with the adjacent spins in addition to spin $\sigma i$ and an external magnetic field coefficient hi.

The Ising model is provided with interaction generally expressed in an undirected graph. Mathematical expression 1 described above includes "Ji,j×$\sigma i$×$\sigma j$" for a term that expresses interaction, however, this expresses interaction from "i"th spin to "j"th spin. At this time, general Ising model does not distinguish interaction from the ith spin to the jth spin and interaction from the jth spin to the ith spin. That is, Ji,j and Jj,i are the same. However, in the Ising chip 100 in the present invention, this Ising model is expanded to a directed graph, and interaction from the ith spin to the jth spin and interaction from the jth spin to the ith spin are made asymmetrical. Hereby, the expressivity of the model is enhanced and multiple problems can be expressed with a smaller-scale model.

Therefore, when one spin unit 300 is considered as a unit including the ith spin σi, Jj,i, Jk,i, Jl,i, Jm,i and Jn,i which are interaction coefficients held by the spin unit determine interaction from adjacent "j"th, "k"th, "l"th, "m"th and "n"th spins σj, σk, σl, σm, on to the ith spin σi.

This is equivalent to that arrows (interaction) to which the interaction coefficients included in the spin unit 300 correspond are directed from the spins outside the spin unit 300 to the spin inside the spin unit 300 in FIG. 8.

(1-5) Circuit Configuration of Spin Unit

To search a ground state of the spin model shown in FIG. 8, the spin unit 300 is configured by a solid-state device. In this embodiment, plural spin units 300 each of which is configured by a semiconductor memory and a logical circuit are arranged and the spin array 110 is configured. One example of the configuration of the spin unit 300 will be described referring to FIGS. 9 and 10 below.

Figure 9:
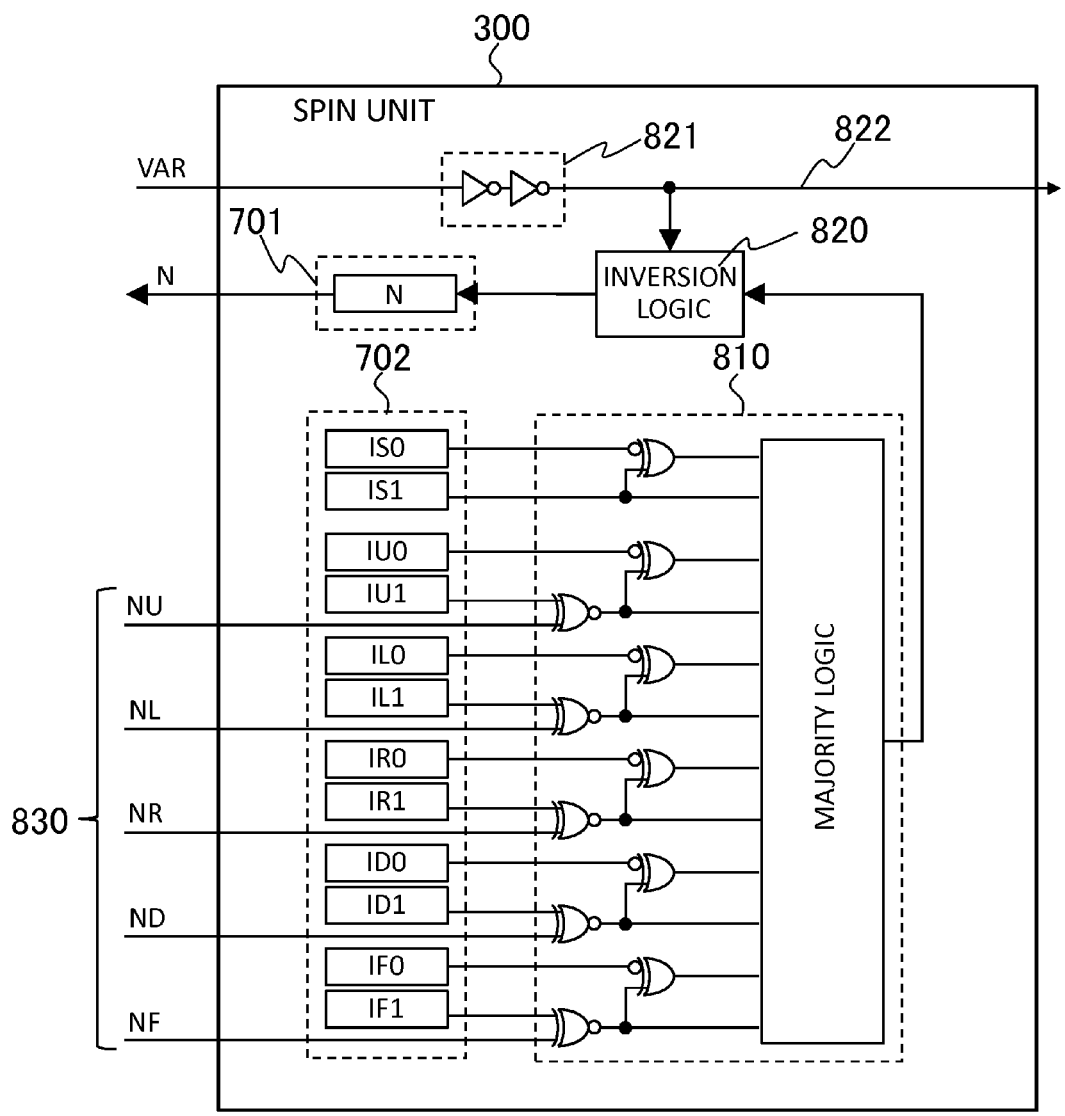
FIG. 9 is a circuit diagram showing an example of configuration in which interaction between spin units is made.

FIG. 9 explains an example of circuit configuration of the spin unit. In FIG. 9, a circuit for realizing interaction between spin units is shown.

Figure 10:
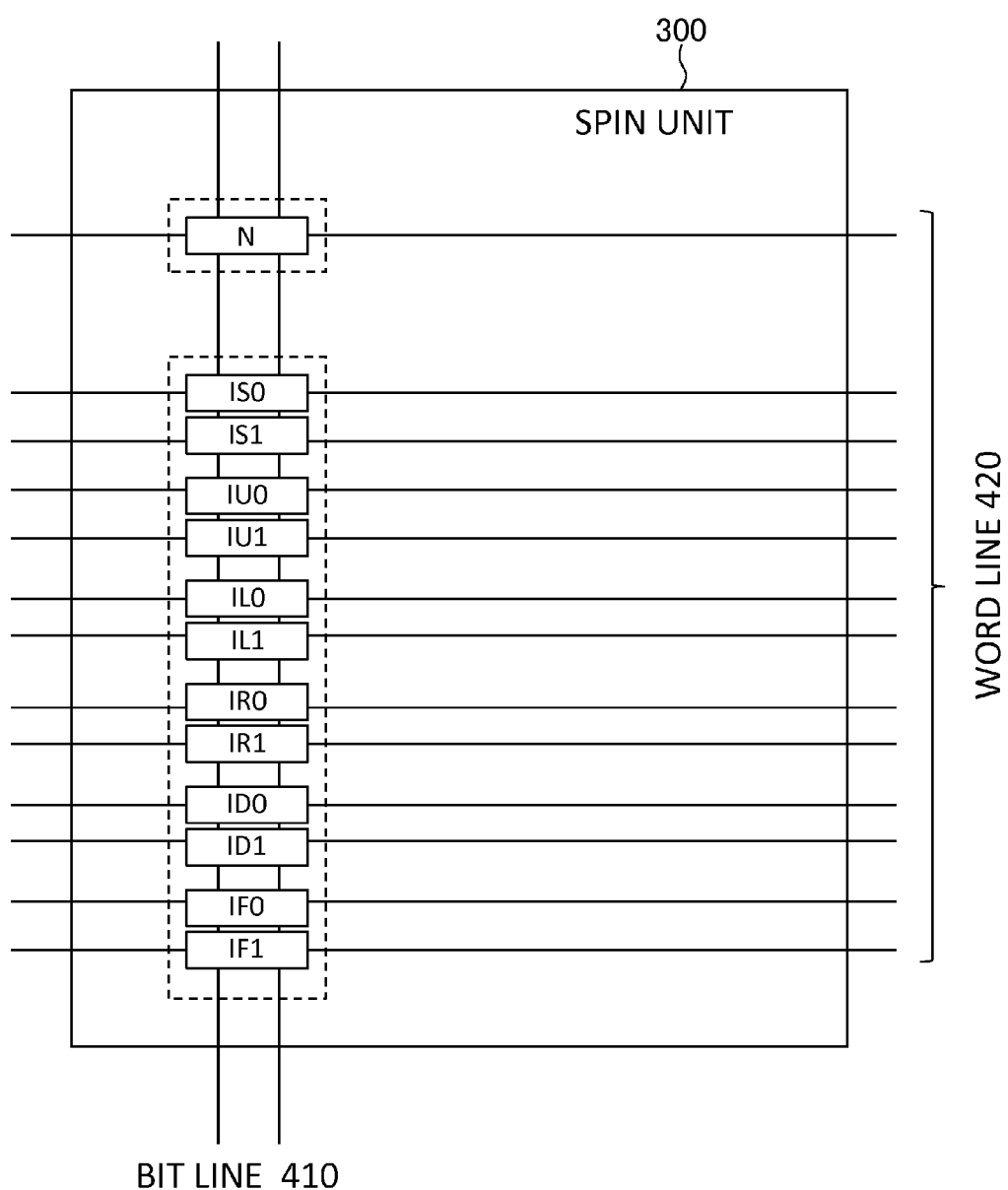
FIG. 10 is a circuit diagram showing an example of configuration for accessing memory cells with which the spin unit is provided.

FIG. 10 shows a word line and a bit line which are an interface for accessing to a memory cell provided to the spin unit from the outside of the Ising chip 100 in the configuration shown in FIG. 9.

One spin unit 300 is provided with both configuration shown in FIGS. 9 and 10. However, to facilitate the understanding of the connection relation of wiring, the configuration is shown in FIGS. 9 and 10 for convenience.

A method of connecting EN, NU, NL, NR, ND, NF and N which are an interface shown in the circuit for realizing interaction shown in FIG. 9 among the plural spin units will be described referring to FIG. 15 later. Besides, a method of connecting the word line and the bit line shown in FIG. 10 among the plural spin units will be described referring to FIG. 13 later.

The spin unit 300 is provided with plural memory cells of 1 bit to hold the spin σi, the interaction coefficients Jj,i, - - -, Jn,i and the external magnetic field coefficient hi respectively of the Ising model. The memory cell of 1 bit is shown as N (701), IS0, IS1, IU0, IU1, IL0, IL1, IR0, IR1, ID0, ID1, IF0, IF1 (IS0 to IF1:702) in FIGS. 9, 10. As IS0 and IS1, IU0 and IU1, IL0 and IL1, IR0 and IR1, ID0 and ID1, and IF0 and IF1 respectively fulfill a role in one pair configured by two, and they are abbreviated to ISx, IUx, ILx, IRx, IDx and IFx in a lump.

For one example of the structure of each memory cell with which the spin unit 300 is provided, a memory cell of well-known SRAM can be utilized. That is, the memory cell is provided with a data storage configured by two CMOS inverters. The read/write of data from/to the data storage is realized by controlling a gate of a pass-gate transistor connected to the inverter in series via the word line and connecting paths to its source and drain to the bit line. However, memory cell structure is not limited to this and has only to be configuration in which at least a binary can be stored. For example, another memory such as DRAM and a flash memory can be used.

In an example shown in FIG. 9, each memory cell is a memory cell which can store 1 bit of SRAM. However, a multivalued memory cell may also be used. One memory cell may also be physically used for the multivalued memory cell and plural 1-bit memory cells may also store plural bits. When the memory cell is multivalued, a degree of freedom of a value of a coefficient which can be used increases. In the meantime, a circuit scale and processing time increase. Accordingly, a suitable memory has only to be selected according to a type of a problem to be solved and application.

Next, description that the spin unit 300 expresses the "i"th spin will be made. The memory cell N is a memory cell for expressing the spin σi and holds a value of the spin. A value of spin is +1/−1 (+1 is also expressed as upper and −1 is also expressed as lower) in the Ising model, however, this is made to correspond to 1/0 which is a binary of the memory cell. In this specification, +1 is made to correspond to 1 and −1 is made to correspond to 0. They may also be reverse.

Figure 11:
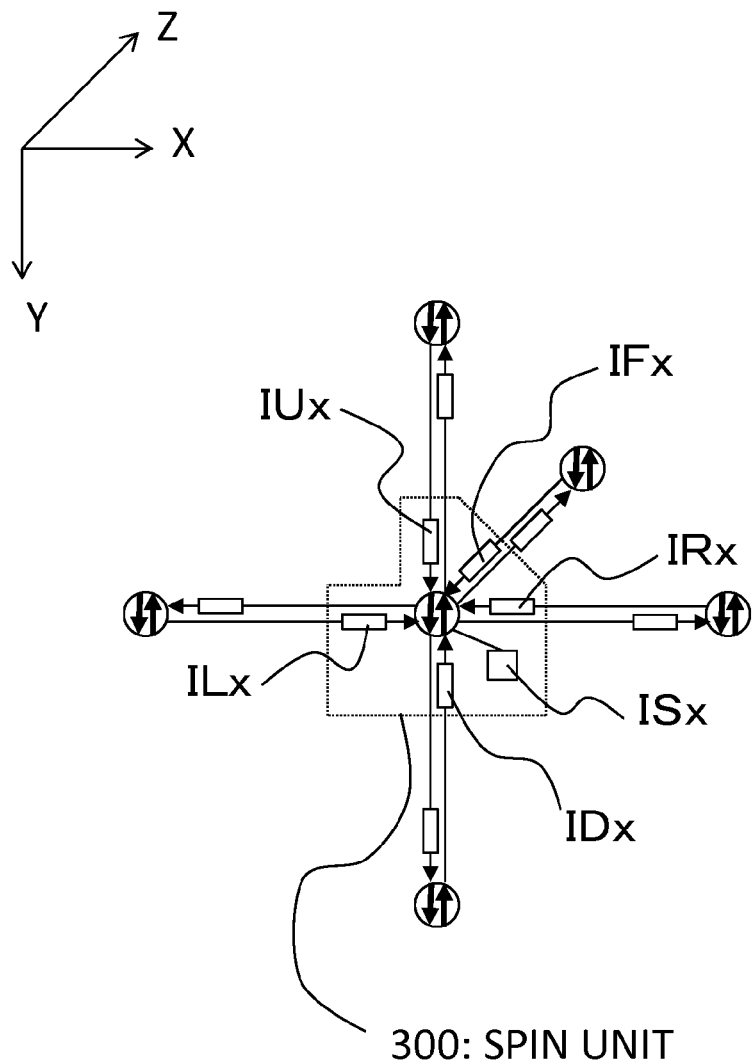
FIG. 11 is a perspective view for explaining an example of the configuration of the spin unit in a three-dimensional grid.

FIG. 11 shows correlation between the memory cells with which the spin unit 300 shown in FIGS. 9 and 10 is provided and the topology of the Ising model shown in FIG. 8. ISx expresses an external magnetic field coefficient. Besides, IUx, ILx, IRx, IDx and IFx respectively express an interaction coefficient. IUx expresses the interaction coefficient with upper spin (−1 in a Y-axis direction), ILx expresses the interaction coefficient with left spin (−1 in an X-axis direction), IRx expresses the interaction coefficient with right spin (+1 in the X-axis direction), IDx expresses the interaction coefficient with lower spin (+1 in the Y-axis direction), and IFx expresses the interaction coefficient with spin connected in a direction toward the depth (+1 or −1 in a Z-axis direction). Besides, in a view from a certain spin when the Ising model is regarded as a directed graph, another spin has a coefficient of an effect which another spin has on the certain spin. A coefficient of an effect which the certain spin has on another spin belongs to respective another spin. That is, the spin unit 300 is connected to five spins at the maximum.

In the Ising chip 100 in this embodiment, the external magnetic field coefficient and the interaction coefficient correspond to three values of +1, 0 and −1. Therefore, to express the external magnetic field coefficient and the interaction coefficient, a memory cell of at least 2 bits is respectively required. As shown in FIGS. 9 and 10, ISx, IUx, ILx, IRx, IDx and IFx express any of the three values of +1, 0, −1 by the combination of two memory cells a numeric value at the end of which is 0 or 1 (for example, in the case of ISx, IS0 and IS1). For example, in the case of ISx, +1/−1 is expressed in IS1, when IS1 is 1, +1 is expressed, and at the time of 0, −1 is expressed. In addition to this, when IS0 is 0, the external magnetic field coefficient is regarded as 0 and when IS0 is 1, either of +1 or −1 determined by contents of IS1 shall be the external magnetic field coefficient. If it is considered that the external magnetic field coefficient is disabled when the external magnetic field coefficient is 0, it can be said that IS0 is an enable bit of the external magnetic field coefficient (when IS0 is 1, the external magnetic field coefficient is enabled). IUx, ILx, IRx, IDx and IFx that express the interaction coefficient similarly make the coefficient and a value of a bit correspond.

FIG. 10 shows relation among a memory cell of the spin unit 300, the word line, and the bit line.

Memory cells N, IS0, IS1, IU0, IU1, IL0, IL1, IR0, IR1, ID0, ID1, IF0 and IF1 in the spin unit 300 are required to be able to be read/written from/to an external device outside the Ising chip 100. Therefore, as shown in FIG. 10, the spin unit 300 is provided with a bit line 410 and a word line 420. As described above, the ternary value of +1, 0 and −1 is expressed by a set of the two memory cells the numeric values at the end of which are 0 and 1 in FIG. 10. However, when a quaternary or more coefficient is to be expressed, the number of the 1-bit memory cells that configure the set is increased and the memory cells have only to be added in a direction of the bit line.

The spin unit 300 is arranged on a semiconductor substrate like tiles and is connected to the bit line 410 and the word line 420. Data stored in the memory cells in the spin unit 300 can be read/written via the SRAM convertible interface of the Ising chip 100 by driving and controlling the spin unit and reading the data by the I/O address decoder 130 and the I/O driver 120 respectively shown in FIG. 6 like general SRAM.

The three-dimensional grid-like Ising model of 3×3×2 shown in FIG. 8 can be mapped in the memory in the Ising chip 100 owing to the abovementioned configuration.

FIG. 12 shows an example of a memory map 2000 of the Ising chip 100. Eighteen blocks corresponding to eighteen sites corresponding to the Ising model shown in FIG. 8 are shown. Each block includes thirteen bits corresponding to N, IS0, IS1, IU0, IU1, IL0, IL1, IR0, IR1, ID0, ID1, IF0 and IF1 respectively shown in FIG. 9.

(1-6) Layout of Spin Units in Spin Array

Figure 13:
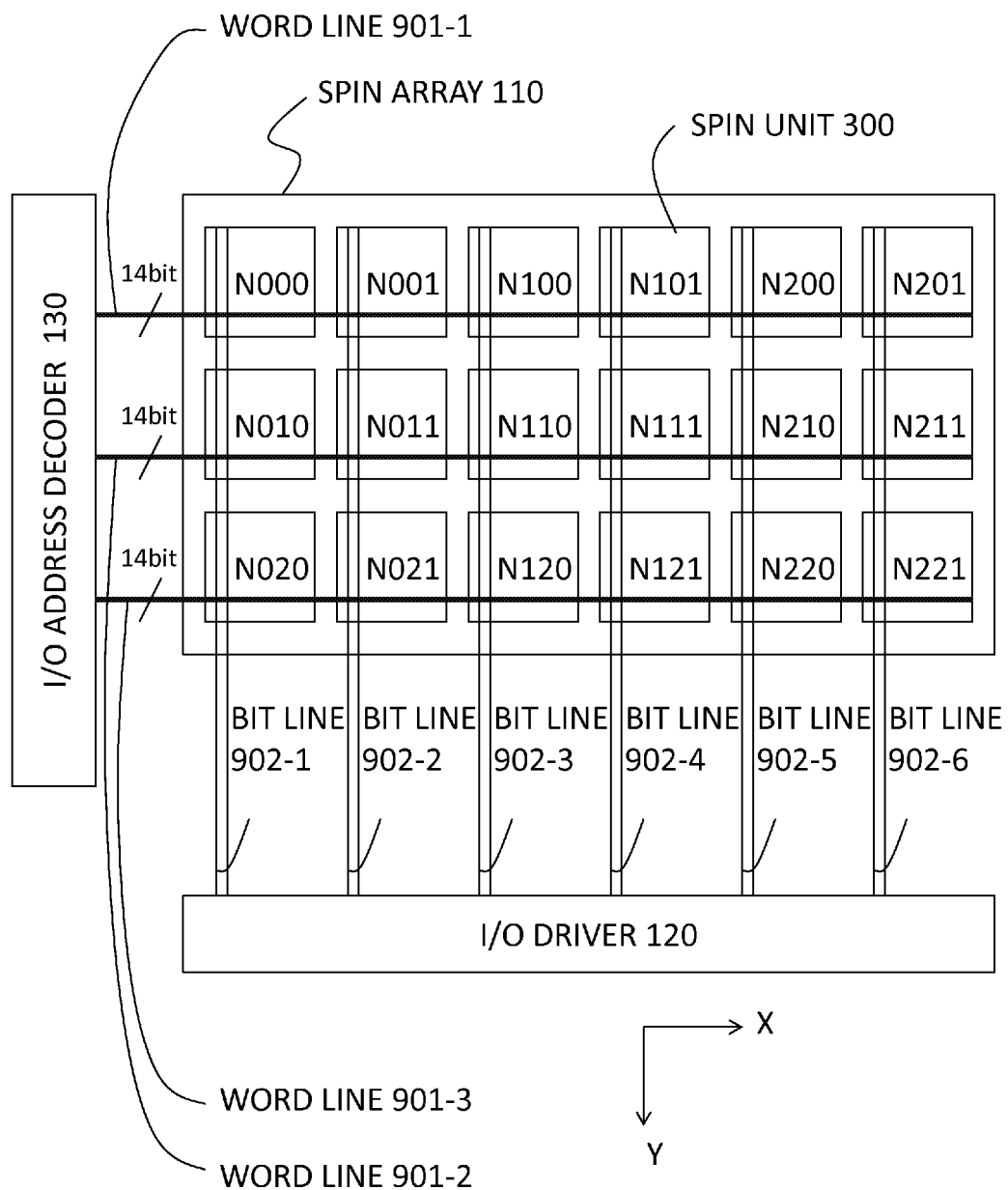
FIG. 13 is a block diagram that explains one example of the arrangement of the spin units in the Ising chip.

FIG. 13 explains one example of the layout of spin units 300 in the Ising chip 100. The configuration of the spin array 110 is shown from a viewpoint of a layout as a semiconductor device.

Figure 14:
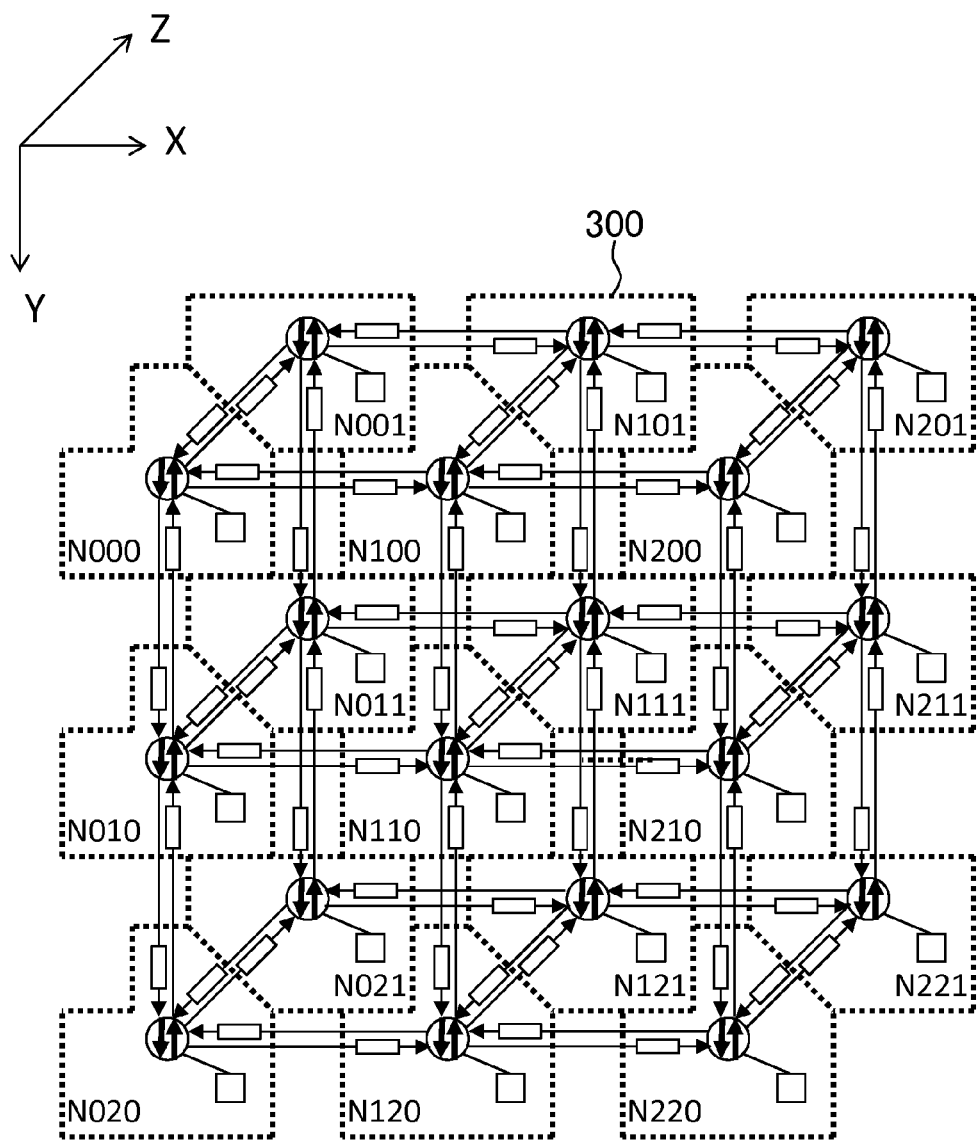
FIG. 14 is a perspective view that explains one example of correspondence between the three-dimensional grid-like spin array and the spin unit.

FIG. 14 shows a state in which a code N000 for identifying the spin unit 300 is added to the spin array shown in FIG. 8. The code is given according to a position on the X-axis, the Y-axis and the Z-axis like Nxyz. As the spin array in this embodiment has three-dimensional grid-like topology, device in the layout is required so as to realize as a semiconductor device in which circuits are configured on a two-dimensional plane. The spin unit is arranged on the two-dimensional plane on a semiconductor substrate in a state in which the topology of the Ising model is maintained and is connected.

In FIGS. 12, 13, a code corresponding to the code N000 of the spin unit 300 in FIG. 14 is expressed and it is shown to which vertex the spin unit 300 expressed in FIGS. 12, 13 corresponds in the three-dimensional grid-like topology shown in FIG. 14. As clear from FIG. 13, in this embodiment, to arrange vertexes in the three-dimensional grid of 3×3×2 on a two-dimensional plane, each vertex in an array of the vertexes in the grid in the Z-axis direction is inserted into space in an array of the vertexes in the gird in the x-axis direction.

That is, in the Y-axis direction (the direction in which the downside of the drawing is positive on the Y-axis) on the two dimensional plane shown in FIG. 13, the spin units Nx0z, Nx1z, Nx2z, - - - are arranged. However, in the X-axis direction (the direction in which the right side of the drawing is positive on the X-axis), the spin units the coordinates in the z-axis direction of which are 0 and 1 are alternately arranged as N0y0, N0y1, N1y0, N1y1, N2y0, N2y1.

The spin units 300 are physically arranged on the Ising chip 100 as shown in FIG. 13, and on those, the word lines 901-1, 901-2, 901-3 shown in FIG. 13 and the bit lines 902-1, 902-2, 902-3, 902-4, 902-5, 902-6 are wired. These word line and bit line are connected to the word line 420 and the bit line 410 of the spin unit 300 shown in FIG. 10. Since each spin unit 300 is provided with 13 memory cells in a direction of an array of the word lines (the word line 420 is 13 bits), the word lines 901-1, 901-2, 901-3 are respectively 13 bits.

(1-7) Control Over Ground State Search Process of Ising Model

To realize the search of the ground state of the Ising model, spin-spin interaction is required to be realized to be a spin array which is lower in the energy of the whole Ising model. The interaction for this is made on the basis of an interaction coefficient and an external magnetic field coefficient respectively given. That is, the next value of certain spin is determined by interaction from another spin connected to the certain spin and an external magnetic field coefficient which the certain spin has. At this time, the next value of the spin becomes such a value that minimizes local energy in a range in which the spin is connected.

It is first considered that for this update of spin, respective spins are sequentially updated one by one. However, in this method, it takes time proportional to the number of spins and parallelism cannot be utilized. Then, it is desirable that spin-spin interaction is made simultaneously and in parallel as to all spins.

However, it is not suitable that the simultaneous update of all spins is tried. As a certain spin is updated on the basis of a value of adjacent spin to minimize energy between the certain spin and the adjacent spin is minimum when the certain spin is updated, both updates are duplicate when a value of the adjacent spin is simultaneously updated, the energy cannot be minimized and is oscillated. That is, it should be avoided that when certain spin is updated, spin connected to the certain spin (spin directly connected to the certain spin via an interaction coefficient is hereinafter called adjacent spin) is simultaneously updated.

Then, in this embodiment, the spin unit 300 in the spin array 110 is grouped not to update adjacent spin simultaneously and only one group shall be updated at a time. In the case of the topology shown in FIG. 8, the spin unit 300 has only to be grouped in two. The two groups are alternately updated.

FIG. 6 is referred again. In the configuration shown in FIG. 6, the Ising chip 100 is provided with the interaction address 180 as an input interface to designate a group to be updated at certain timing. The interaction address 180 is an interface for designating the group to be updated out of the abovementioned groups and spins (the spin units 300) that belong to the group designated by the interaction address 180 are simultaneously updated according to the input of the interaction clock 181.

According to this method, no additional hardware is required in the spin unit 300 and one pair of interaction address decoders 140 has only to be provided to the whole Ising chip 100. Therefore, the abovementioned problem can be settled without making the spin unit 300 which is a configuration unit intricate.

In the abovementioned example, the spin unit is grouped in two not to update adjacent spin simultaneously. However, in the case of grouping in which adjacent spin is not simultaneously updated, the spin unit may also be grouped in three or more.

(1-8) Circuit Configuration for Determining Next Spin State

Referring to FIG. 9 again, the abovementioned circuit configuration will be described below.

The spin unit 300 independently has a circuit for computing interaction and determining the next state of spin every spin unit 300 every the spin unit 300 to simultaneously update plural spins in parallel. FIG. 9 shows the circuit for determining the next state of spin. In FIG. 9, the spin unit is provided with NU, NL, NR, ND, NF and N as an interface with an external device. The N is an interface that outputs a value of spin in the spin unit to another spin unit (an adjacent unit in the topology shown in FIG. 8). The NU, the NL, the NR, the ND and the NF are the interface 830 for inputting a value of spin with which other spin units respectively have. The NU receives input of spin on the upside (−1 in the y-axis direction), the NL receives input of spin on the left side (−1 in the x-axis direction), the NR receives input of spin on the right side (+1 in the x-axis direction), the ND receives input of spin on the downside (+1 in the y-axis direction), and the NF receives input of spin connected in the direction toward the depth (+1 or −1 in the z-axis direction). In view of the topology of the Ising model, the processing of an edge is required to be determined.

When an edge is merely truncated as in the topology shown in FIG. 8, nothing is required to be input to the interface corresponding to the edge out of the NU, the NL, the NR, the ND and the NF (suitable processing such as connecting to a fixed value of 0 or 1 is performed in the circuit as an unused input terminal). For example, in the case of a spin unit of N000, nothing is input to two terminals of the NU and the NL.

In the spin unit 300, the next state of spin is determined so that energy is minimum between certain spin and adjacent spin, however, it is equivalent to judging which of a positive value or a negative value is dominant in the evaluation of the product of the adjacent spin and an interaction coefficient and an external magnetic field coefficient. Assuming that spins σj, σk, σl, σm, σn are adjacent to "i"th spin σi, the next state of the spin σi is determined as follows. First, values of the adjacent spins shall be σj=+1 σk=−1, σl=+1, σm=−1 and σn=+1, the interaction coefficient shall be Jj,i=+1, Jk,i=+1, Jl,i=+1, Jm,i=−1 and Jn,i=−1, and the external magnetic field coefficient hi shall be +1. At this time, the product of the interaction coefficient and the adjacent spin and the external magnetic field coefficient are respectively as follows; σj×Jj,i=+1, σk×Jk,i=−1, σl×Jl,i=+1, σm×Jm,i=+1, σn×Jn,i=−1, and hi=+1. The external magnetic field coefficient may be ordinarily regarded as an interaction coefficient with spin having a value of +1.

Local energy between "i"th spin and adjacent spin is acquired by multiplying the abovementioned coefficient by a value of the ith spin and further, inverting its sign. For example, as local energy between the ith spin and "j"th spin is −1 when the ith spin is +1 and is +1 when the ith spin is −1, the local energy is decreased when the ith spin is +1.

In the consideration of such local energy between certain spin and any adjacent spin and its external magnetic field coefficient, it is computed which of +1 or −1 as a value of "i"th spin can diminish energy. This has only to be count which of +1 or −1 is major in the line of the abovementioned product of the interaction coefficient and adjacent spin and the external magnetic field coefficient. In the abovementioned example, +1 is four pieces and −1 is two pieces. If the ith spin is +1, the total of energy is −2 and if the ith spin is −1, the total of energy is +2. Therefore, the next state of the ith spin the energy of which is to be minimized can be determined on the basis of majority that when the number of +1 is major, the next state of the ith spin shall be +1 and when the number of −1 is major, the next state of the ith spin shall be −1.

A logical circuit 810 shown in the spin unit 300 shown in FIG. 9 is a circuit for making the interaction. First, the next state of spin that minimizes energy in view of only interaction can be computed in exclusive-NOR operation (XNOR operation) with a memory cell that shows which of +1 or −1 the product of a state of adjacent spin and the interaction coefficient is (+1 shall be encoded as 1 and −1 shall be encoded as 0). If the interaction coefficient is only +1 and −1, the next state of spin can be determined if it is determined by majority logic which of +1 or −1 in this output is major. As for the external magnetic field coefficient, if it is considered to be equivalent to an interaction coefficient with spin which is always in a state of +1, a value of the external magnetic field coefficient is merely a value to be input to the majority logic that determines the next state of spin.

Next, a method of realizing the coefficient 0 will be described. When there is majority logic f (I1, I2, I3, - - - , In) having "n" pieces of inputs, it can be said that the following proposition is true. First, there shall be duplicates I'1, I'2, I'3, - - - , I'n of the inputs I1, I2, I3, - - - , In (as to arbitrary k, Ik=I'k). At this time, the output of f (I1, I2, I3, - - - , In) is equal to f (I1, I2, I3, - - - , In, I'1, I'2, I'3, - - - , I'n) to which the duplicates are also added. That is, even if two input variables are input for each are input, the output is unchanged. Further, there shall be another input Ix and its inversion !Ix in addition to the inputs I1, I2, I3, - - - , In. At this time, the output of f (I1, I2, I3, - - - , In, Ix, !Ix) is equal to f (I1, I2, I3, - - - , In). That is, when the input variable and its inversion are input, the effect of the input variable is canceled in majority. The coefficient 0 is realized utilizing this property of the majority logic.

Concretely, as shown in FIG. 9, a duplicate or its inversion of a candidate value of the abovementioned next state of spin is simultaneously input to the majority logic according to a value of a bit (IS0 and others) that determines whether the coefficient is enabled or not utilizing XOR. For example, as a value of IS1 and a value of the inversion of IS1 are simultaneously input to the majority logic when IS0 is 0, the external magnetic field coefficient has no effect (the external magnetic field coefficient is equivalent to 0). Besides, when IS0 is 1, a value of IS1 and the same value (a duplicate) as the value are simultaneously input to the majority logic.

As spin and each coefficient take a binary or ternary value in the abovementioned description, the circuit is realized using a majority logic circuit. However, as described above, the essence of the search of the ground state is to judge which of a positive value or a negative value is dominant when the product of adjacent spin and the interaction coefficient and the external magnetic field coefficient are evaluated. Therefore, when spin and each coefficient have a multiple value, the circuit can be realized as respective adders of a positive value and a negative value.

(1-9) Avoidance of Local Optimum Solution in Search of Ground State of Ising Model (1-9-1) Method of Using Random Number Generator The search of the ground state of the applied Ising model can be realized by the abovementioned minimization of energy by interaction between spins, however, the search may be led into local optimum solution by only this. In the abovementioned logical circuit 810, as there is basically only motion in a direction in which energy is decreased, escape from the local optimum solution when the search is once led into it is impossible and the search does not reach global optimum solution. Therefore, to escape from the local optimum solution, processing that allows transition for increasing energy at predetermined probability is taken in.

In this embodiment, a value of spin is inverted at probability determined at virtual temperature T. In this case, a process of the search of the ground state is compared to physical annealing by the temperature T. At the beginning of the search of the ground state, high temperature is set, local search is made, gradually lowering the temperature, and cooling is made to a state in which the temperature finally becomes zero.

Referring to FIG. 6 again, in this embodiment, to invert a value of spin at predetermined probability, the random number generator 150 and the random number generation clock 160 are used. The bit controller 151 controls a bit output from the random number generator 150 so that a value of spin is inverted at high probability at the beginning of the search of the ground state and the value of the spin is inverted at low probability in the end. Concretely, the bit controller controls output so that multiple values are 1 at the beginning of the search of the ground state and multiple values are 0 in the end of the search of the ground state by extracting the predetermined number of bits from the output of the random number generator 150 and operating the bits in a multi-input AND circuit or a multi-input OR circuit.

In FIG. 9, output from the bit controller 151 is VAR. The output VAR from the bit controller passes an amplifier 821 and is input to an inversion logical circuit 820. A value of spin which is local solution is output from the logical circuit 810, however, when VAR is 1 in the inversion logical circuit 820, the value of the spin is inverted. As described above, the value inverted at predetermined probability is stored in the memory cell 701 that stores the value of the spin.

A line 822 is configuration for sharing the single random number generator 150 and the single bit controller 151 in the plural spin units 300 and transfers the output of the bit controller 151 to the adjacent spin unit. The amplifier 821 is provided not to reduce the output when the output of the bit controller 151 is branched.

A random number generation circuit may also be provided in each spin unit 300 in place of providing the random number generator 150 in the Ising chip 100 and transferring a random number to each spin unit as shown in FIG. 6. Besides, a random number generator circuit is provided outside the Ising chip 100 and a random number may also be transferred from the outside of the chip.

(1-9-2) Method of Controlling Power-Supply Voltage

In the example shown in FIG. 6, the random number generator is used, however, for another means for generating transition that increases energy at predetermined probability, a method of inducing a bit error of the memory cell by dropping power-supply voltage supplied to the memory cell that expresses spin and varying a spin array at random can be given.

For configuration for that, the memory cell that holds the coefficient out of the memory cells with which the spin unit 300 is provided is operated at voltage supplied by a normal power line and the memory cell N that expresses spin is operated at voltage supplied by a power line dedicated to spin. A component except the memory cell, for example, a logical gate for computing interaction and others are all operated at voltage supplied by the normal power line.

A bit error rate of the memory cell is proportional to supply voltage to the memory cell. Generally, voltage of approximately 1 V is supplied to the memory cell and a bit error rate suitable for holding stored contents is used. When voltage is dropped from this voltage, the bit error rate is also deteriorated in proportion as a rate of a drop of voltage. For example, the bit error rate is turned to approximately 10 to 1 by dropping voltage to approximately 0.6 V and such a state in which a bit error is apt to be caused is used for escape from the local optimum solution.

Therefore, to prevent from being led into the local optimum solution by more widely searching solution space at the beginning of the search of the ground state for example, low power supply voltage such as 0.6 V is supplied to the power line for spin and the abovementioned memory cell N that stores a value of spin searches the ground state by interaction in a situation in which a random bit error is caused. In this situation, energy is basically turned small by interaction, however, in parallel with it, as the state is turned by a bit error at random, transition to a state which cannot be turned by only interaction is also caused, and the solution space can be widely searched. To stabilize a state together with a progress of the search of the ground state, voltage is gradually varied to be a state in which a bit error is hardly caused.

(1-10) Wiring Between Spin Units

Figure 15:
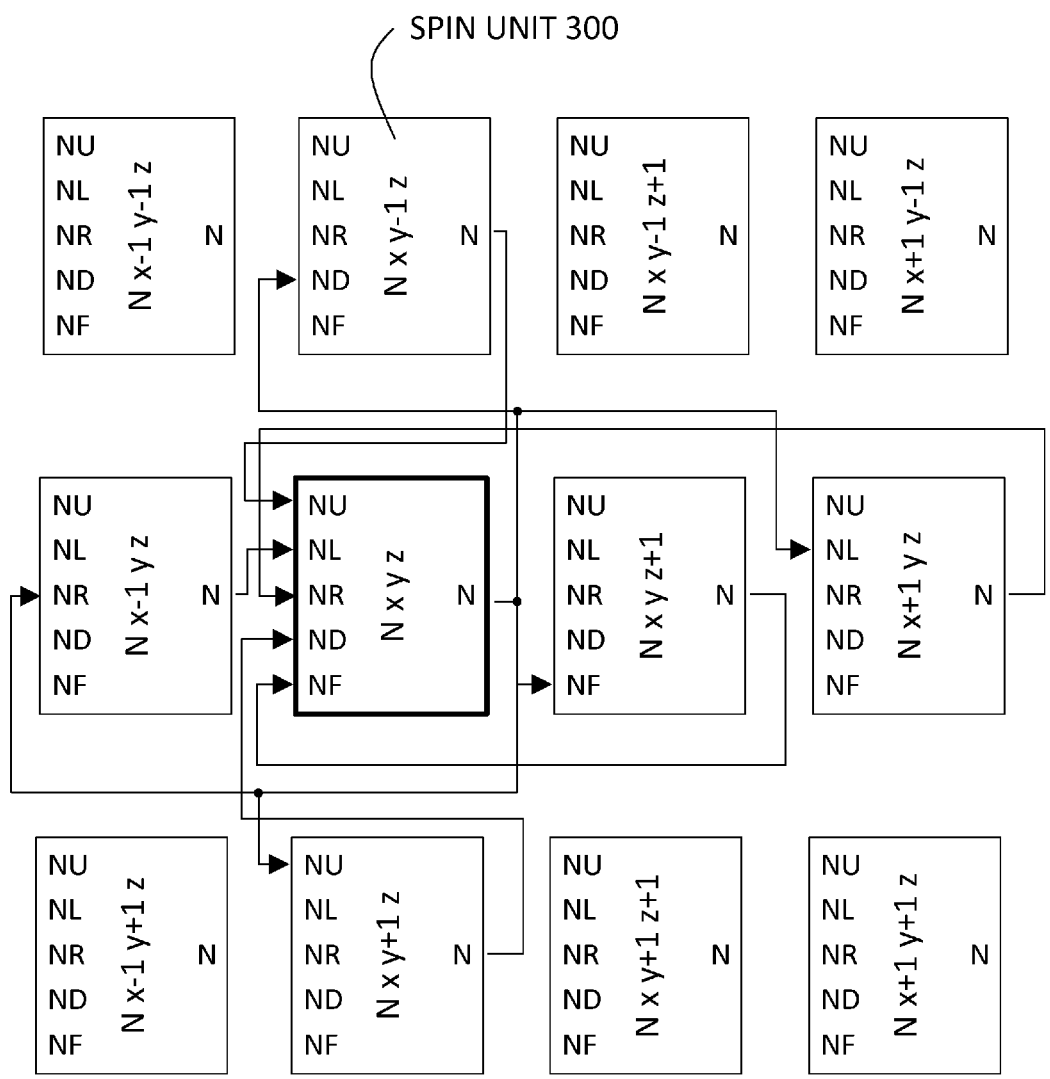
FIG. 15 is a wiring diagram that explains one example of wiring in which interaction between the spin units is made.

FIG. 15 explains one example of wiring for making interaction between the spin units.

FIG. 15 shows the example of the wiring between the NU, the NL, the NR, the ND, the NF and the N which are the interface of the spin unit shown in FIG. 9. FIG. 15 shows the wiring suitable for realizing the topology shown in FIG. 8 in the spin units arranged as shown in FIG. 13 when certain one spin unit Nxyz is taken notice of. The topology shown in FIG. 8 can be realized in the circuit by wiring every spin unit as described above.

(1-11) Operational Sequence

Figure 16:
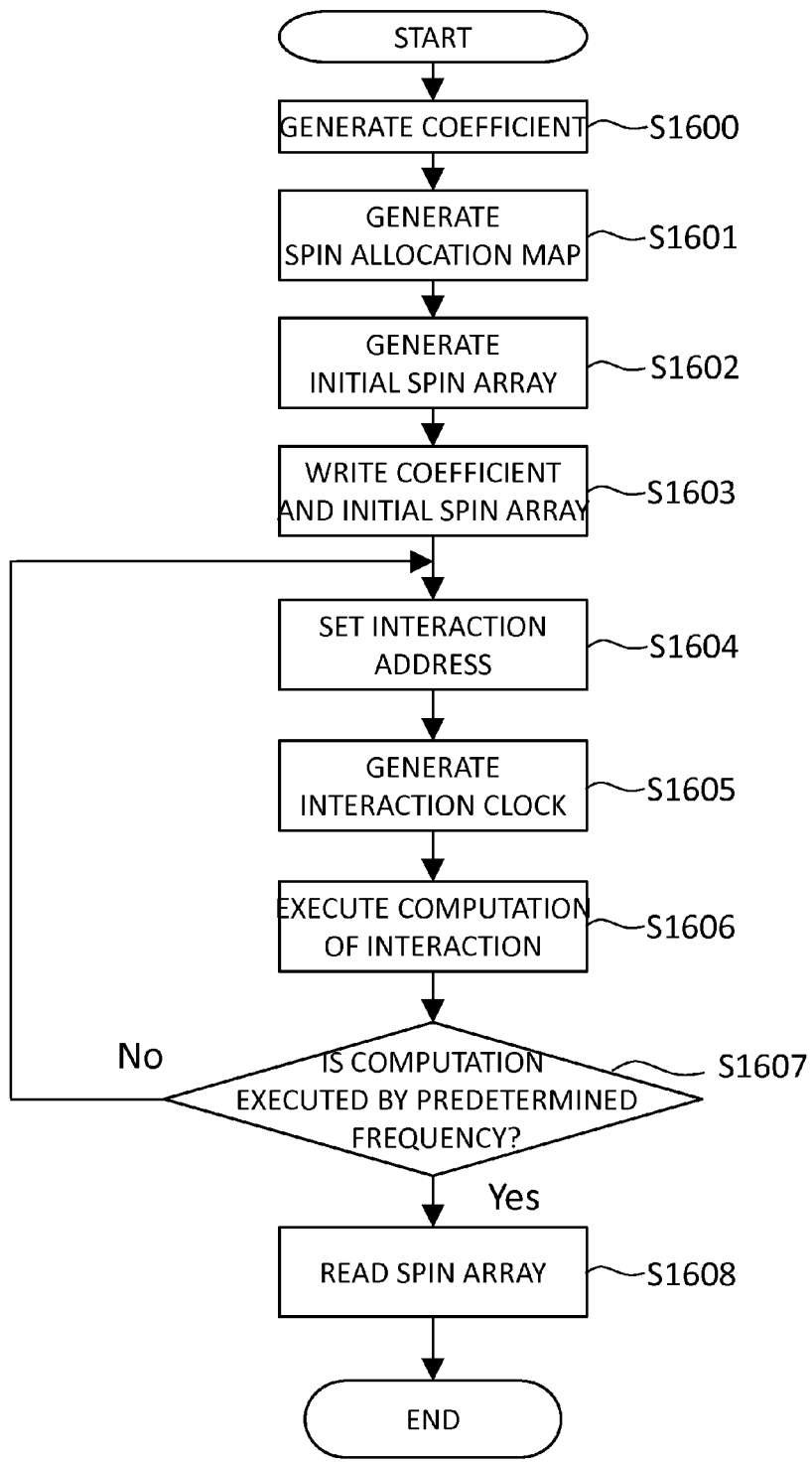
FIG. 16 is a flowchart that explains one example of a procedure for controlling the Ising chip.

FIG. 16 shows an outline of a procedure for controlling the Ising chip 100 by the CPU 210 in the processor 200 and searching the ground state.

In a step S1600, an interaction coefficient of the Ising model that represents the target problem and an external magnetic field coefficient are generated. This means that in an example of the maximum cut problem, when the maximum cut problem shown in FIG. 3 is given, the Ising model shown in FIG. 4 is generated.

In a step S1601, a spin allocation map is generated. The spin allocation map is information in which it is defined how the Ising model is allocated to the Ising chip 100 when the Ising model to be solved is solved. For example, the Ising model shown in FIG. 4 is applied to the three-dimensional grid shown in FIG. 14, this is mapped in the spin array shown in FIG. 13, and the memory map shown in FIG. 12 is generated.

In a step S1602, an initial spin array is generated. Normally, an initial value of spin shall be a random value.

In a step S1603, the coefficients and the initial spin array are written to the spin array on the basis of the memory map.

In a step S1604, an interaction address is set and for example, a first group and a second group of the spin array are alternately designated.

In a step S1605, clocks for the first group and the second group of the spin array are similarly generated.

In a step S1606, a value of the spin array is read according to the interaction address and the interaction clock, the next state of spin is determined, and the spin is rewritten. At this time, the spin is rewritten at predetermined probability at random not to be led into local solution as described above.

When computation for interaction is made by a predetermined frequency in a step S1607, a spin array is read in a step S1608. This spin array is solution.

The abovementioned whole control can be made on the basis of software stored in the RAM 220 by the CPU 210 of the information processor shown in FIG. 7.

(1-12) Data Structure and Format that Represent Ising Model

Figure 17:
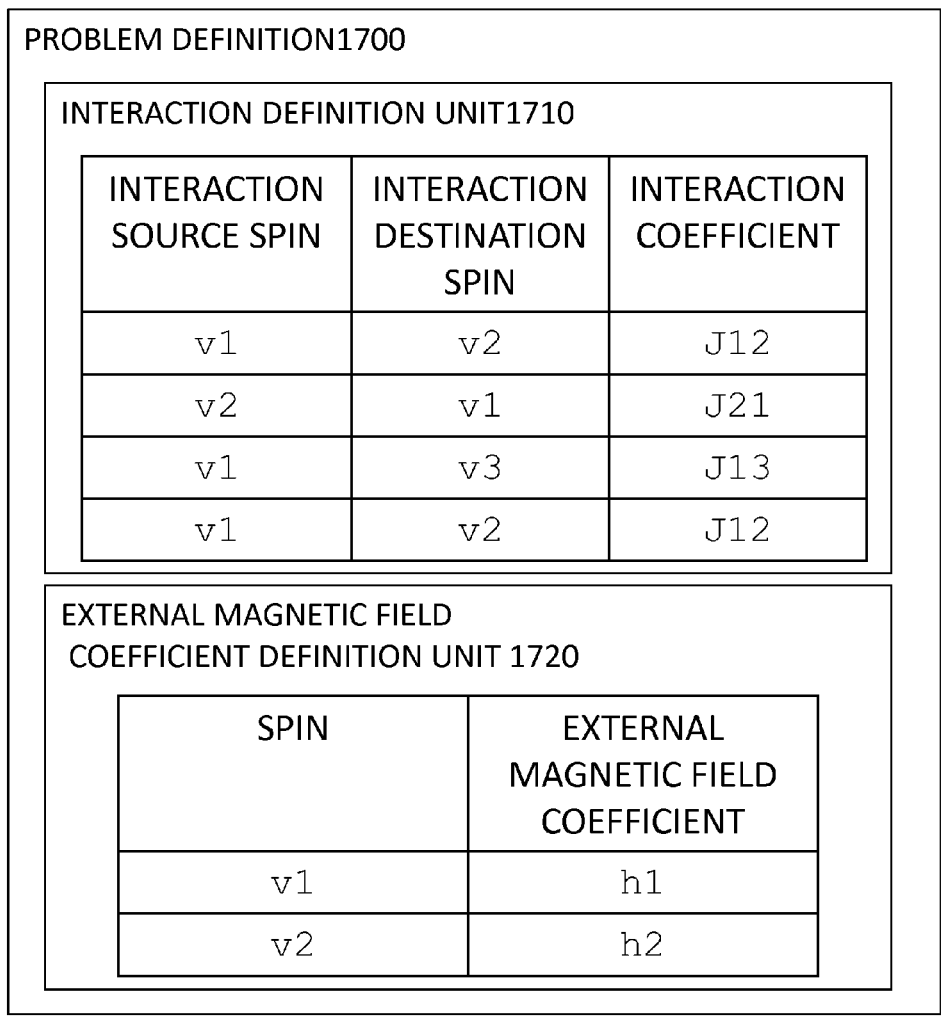
FIG. 17 is a table showing the configuration of the problem definition of the Ising chip.

FIG. 17 shows an example of data structure that represents the Ising model in the information processor 200. The Ising model is defined in a problem definition 1700 and the problem definition is configured by an interaction definition unit 1710 that defines an interaction coefficient and an external magnetic field coefficient definition unit 1720 that defines an external magnetic field coefficient.

The interaction definition unit 1710 arranges one set including an identifier that specifies spin as a source of interaction (for example, a unique number is allocated to the spin and is set as the identifier), an identifier of spin as a destination of interaction and an interaction coefficient by the number of interactions. This is close to an adjacency list which is data structure when a graph is handled on a computer. In this case, the represented Ising model is a directed graph.

The external magnetic field coefficient definition unit 1720 arranges one set including an identifier that specifies spin which applies an external magnetic field and an external magnetic field coefficient by the number of external magnetic field coefficients.

An interaction coefficient between spins not defined in the interaction definition unit 1710 and an external magnetic field coefficient to spin not defined in the external magnetic field coefficient definition unit 1720 shall be zero (0). That is, a default value is 0 showing that no interaction exists between the corresponding spins in the case of an interaction coefficient and is 0 showing that no external magnetic field exists between the corresponding spins in the case of an external magnetic field coefficient.

FIG. 18 shows one example of a format (a file format) of more concrete transcription of the data structure shown in FIG. 17, especially when data is held in the HDD 260. The data structure shown in FIG. 18 is realized as a text file in the HDD 260. For a format of the text file, an identifier for identifying interaction or an external magnetic field, an identifier of spin and a coefficient are lined as shown as problem data 1800 in FIG. 18.

(1-13) Data Structure and Format that Represent Solution

Figure 19:
FIG. 19 is tables showing the configuration of solution data of the Ising chip.

FIG. 19 shows an example 1900 of data structure that represents solution data showing a spin array to be solution or a solution candidate read in the reading of a spin array (S1608) shown in FIG. 16 in the information processor 200 and an example of a format in the HDD 260. As the solution of the Ising model is the spin array, its data structure includes a list of one pair of an identifier of spin and a value of the spin as shown in the solution 1900. On the premise that values of all spins are written without omission, solution data 1920 in which the identifiers of the spins are omitted and only the values of the spins are enumerated can be held as a text file in the HDD 260.

(2) Expansion to Pseudo-Quantum Annealing (2-1) Method of Expressing Quantum Bit In the configuration described in (1) the basic configuration of the Ising chip, an upward state and a downward state of spin can be expressed in the 1-bit memory cells. In this configuration, in a concept called Simulated Annealing (SA), transition probability equivalent to temperature is simulated by inversion at the predetermined probability of spin described in (1-9) avoidance of local optimum solution in the search of the ground state of the Ising mode.

In the meantime, for a method of searching the ground state by a process similar to quantum fluctuation, quantum annealing (QA) is known. The quantum annealing is a method of acquiring a stable state of original Hamiltonian by introducing an external parameter into the original Hamiltonian and gradually lowering it. In the quantum annealing, a value of spin is a state in which an upward state and a downward state exist with the states superposed. That is, spin does not take a classical binary value, the upward state or the downward state is not settled due to quantum mechanical behavior, and the upward state or the downward state is stochastically observed in observation.

Such a state of quantum mechanical spin (quantum spin) is required to be expressed by a quantum bit that does not take a simple binary value and cannot be stored in the 1-bit memory cell. The quantum bit can have a binary and its superposed state. In addition, the superposition is not only such a state that 0 and 1 are half-and-half (when a binary is 0 and 1, the binary can also be regarded as −1 and +1) but can take various probability. However, to realize the quantum bit, a high grade physical system is required and as a state is settled by observation (not the superposed state), various techniques for suppressing disturbance are required. Therefore, special operational environment such as being operated at extremely low temperature is often required.

Figure 20:
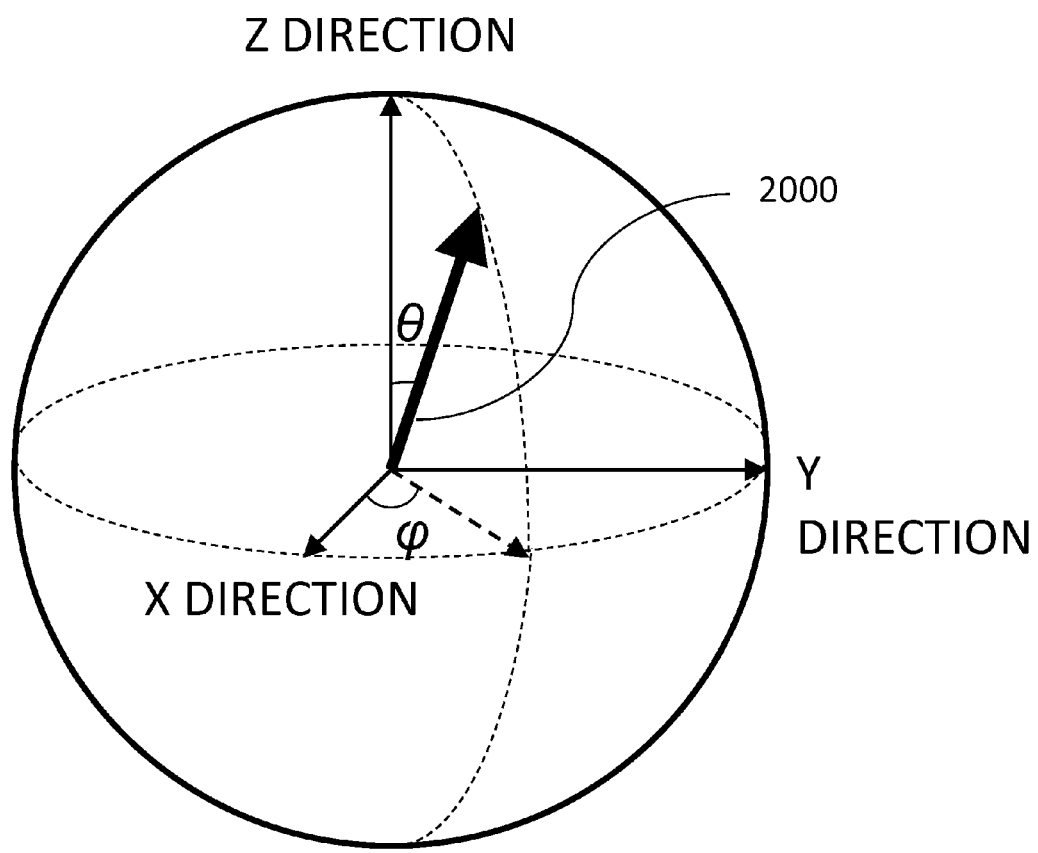
FIG. 20 is a perspective view showing Bloch sphere that represents a quantum state.

FIG. 20 shows Bloch sphere which is notation for representing a quantum state on a unit spherical surface. A state of a quantum bit has a degree of freedom in X, Y, Z directions in the Bloch sphere and can be represented as a unit vector 2000 provided by elements $\theta$, $\Phi$. A state of superposition is different depending upon where on the surface of the Bloch sphere the unit vector 2000 points.

Figure 21:
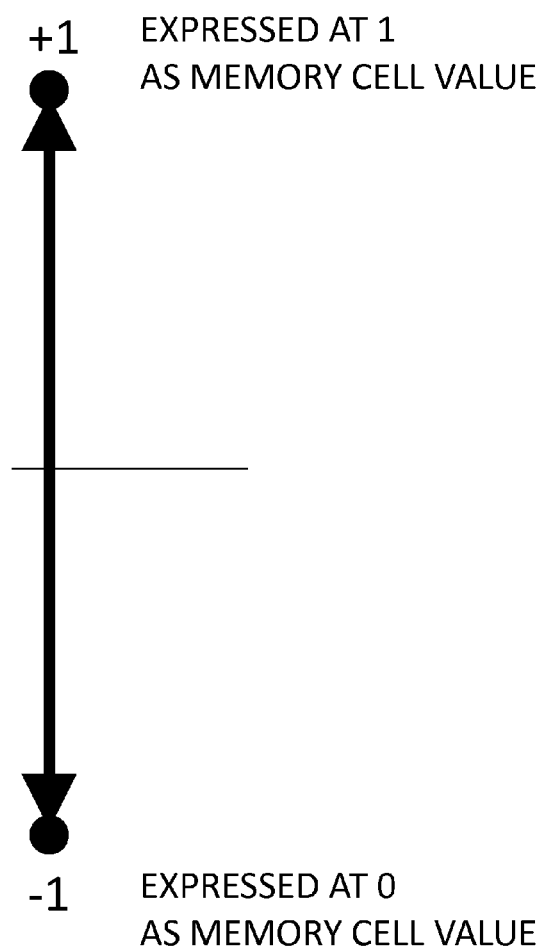
FIG. 21 is a conceptual drawing showing a state of spin expressed by a binary.

FIG. 21 shows a state of classical binary spin and the spin has only a state of +1 and a state of −1. This is equivalent to that the unit vector is fixed onto the z-axis on the Bloch sphere. In this case, to simulate operation like quantum annealing in the Ising model, a concept of a transverse magnetic field is introduced as an external parameter that expresses a state of quantum spin. The transverse magnetic field shall be represented as force in the X direction in the Bloch sphere shown in FIG. 20.

Figure 22:
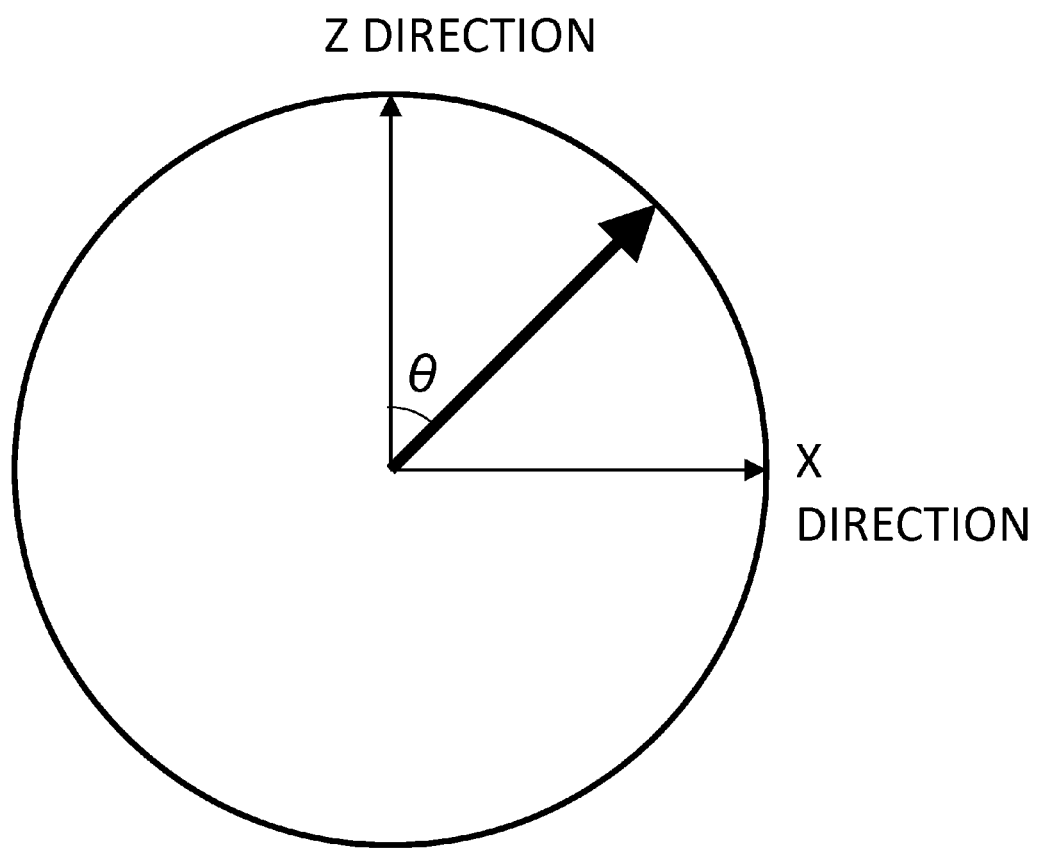
FIG. 22 is a conceptual drawing showing quantum spin represented in a state in which a transverse magnetic field in an x direction on an xz plane of the Bloch sphere is introduced.

FIG. 22 shows the quantum spin represented using the concept of the transverse magnetic field in the X direction in the Bloch sphere shown in FIG. 20. To introduce the transverse magnetic field, the X direction and the Z direction have only to be able to be defined and as a parameter in the Y direction is not used, FIG. 22 is equivalent to a state in which the Bloch sphere is cut on a plane where y=0 (that is, $\Phi$=0).

Figure 23:
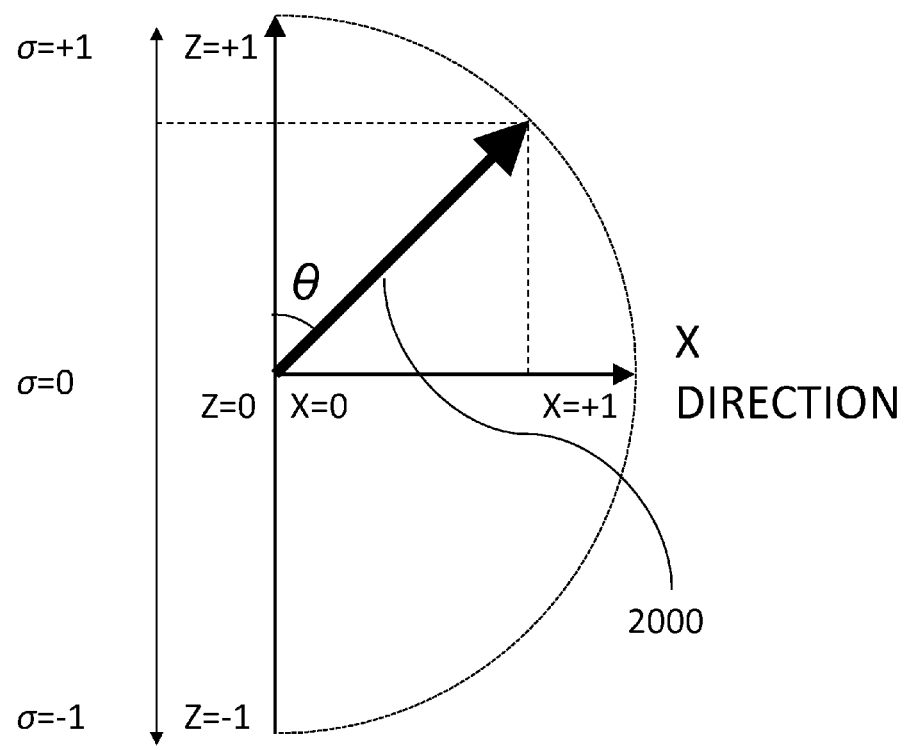
FIG. 23 is a conceptual drawing showing a state of the quantum spin when x takes only positive values.

FIG. 23 shows a state of the quantum spin when x has only a positive value in FIG. 22. As the transverse magnetic field has only a positive value, a state of spin represented by a unit vector 2000 shown in FIG. 23 has only to be able to be handled in the Ising chip. Therefore, a method of expressing the state of spin with $\theta$ and $\Phi$, a method of representing on the xz coordinates and a method of representing with the projection on the x-axis or on the z-axis of the unit vector can be given. For example, according to the method of representing with the projection on the z-axis of the unit vector, a spin variable $\delta$ can take an arbitrary value from +1 to −1 as shown in FIG. 23. Besides, handling in the Ising chip can be facilitated by quantizing the arbitrary value.

Figure 24:
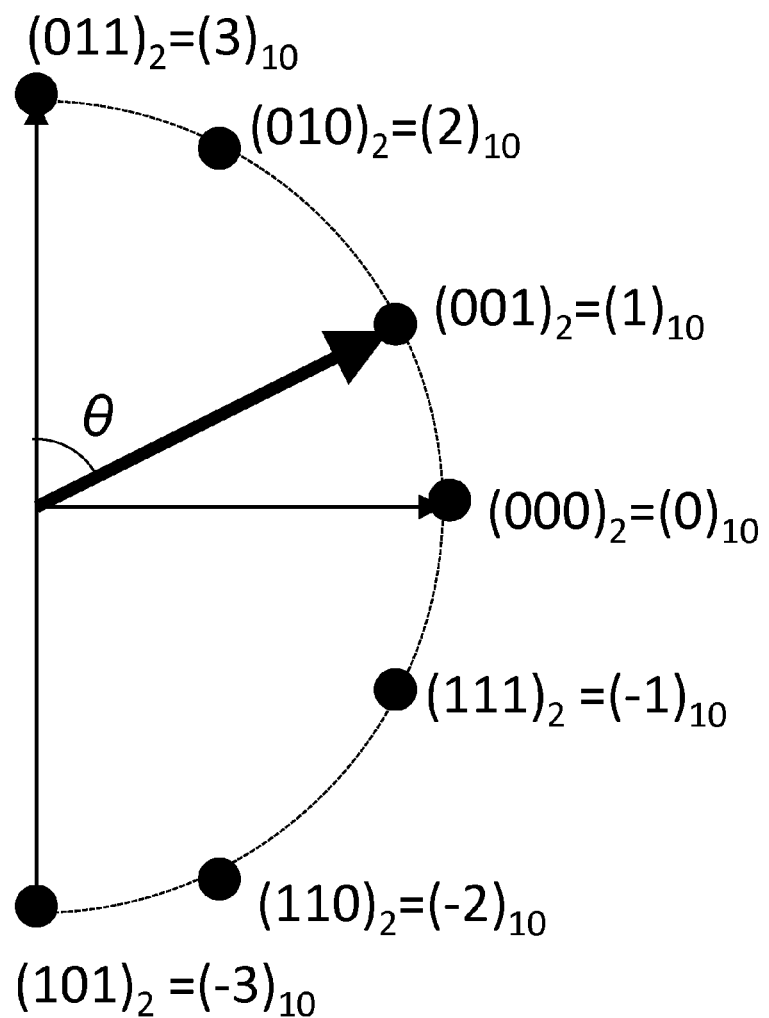
FIG. 24 is a conceptual drawing showing a state of the quantum spin at a multiple value of three bits.

FIG. 24 shows a concept when the quantum spin is digitized as 3 bits. Out of integers +3 to −4 which can be expressed by a 3-bit signed binary, +3 to −3 are used and −4 is unused. As described above, a state of the quantum spin can be approximately expressed by a discrete multiple value and this is equivalent to an expectation value at which the spin takes values of +1 and −1.

In the following example, the Ising model will be described. However, technique described below provides a device and a method which can respectively execute the computation of a function expressing a system also represented by the interaction model by the introduction of a multivalued concept introduced into an entity (for example, spin) without a problem. As described above, the present invention can be applied to not only the Ising model but the general computation of the interaction model.

(2-2) Setting of Coefficient and Operation of Spin Next State

In this embodiment, an example in which processing like quantum annealing is realized in the Ising chip will be described.

The following mathematical expression 3 shows a condition for determining the next state of spin when the spin and a coefficient take a binary. In this case, $\delta_n[t]$ shows a value of "n"th spin at time t. N denotes a set of adjacent spins and the nth spin is spin included in the adjacent spins. $J_{ij}$ denotes an interaction coefficient between "i"th spin and "j"th spin. "$h_i$" denotes an external magnetic field coefficient of the ith spin.

Fi[t] denotes an effective magnetic field of the ith spin at time t. This expression is equivalent to the mathematical expression 1. The next state $\delta_i[t+1]$ can be determined on the basis of the computed value of Fi[t]. The determination of the next state of spin made on the condition in the mathematical expression 3 can be realized in the circuit shown in FIG. 9.

$$F_i[t] = \sum_{n \in N} J_{ni}\delta_n[t] + h_i \qquad \text{[Mathematical expression 3]}$$

Value of memory cell for spin $$\delta_i[t+1] = \begin{cases} +1 & \text{if } F_i[t] > 0 \Rightarrow N = 1 \\ -1 & \text{if } F_i[t] < 0 \Rightarrow N = 0 \\ \text{Don't care} & \text{if } F_i[t] = 0 \Rightarrow N = 1 \text{ or } 0 \end{cases}$$

A mathematical expression 4 expresses a state of spin by a discrete multiple value and shows a condition for the determination of the next state of spin when processing like quantum annealing is realized. $\delta_n[t]$ denotes a value of the nth spin at time t.

$$z_i[t] = \alpha[t]\left(\sum_{n \subset N} J_{ni}\delta_{ni}[t] + h_i + r_i[t]\right) \qquad \text{[Mathematical expression 4]}$$

$$x_i[t] = (1 - \alpha[t])\gamma$$

$$\delta_i[t+1] = \frac{z_i[t]}{\sqrt{x_i[t]^2 + z_i[t]^2}}$$

Here, as the value of the spin takes a multiple value, $\delta_n[t]$ takes an arbitrary real number from +1 to −1. The definition of N, $J_{ij}$ and $h_i$ is similar to Mathematical expression 3. Besides, the interaction coefficient $J_{ij}$ and the external magnetic field coefficient $h_i$ shall take a multiple value.

$r_i[t]$ denotes random noise observed by the ith spin at the time t. $\alpha[t]$ denotes a schedule coefficient at the time t. "γ" denotes a transverse magnetic field coefficient and shall take a multiple value.

When the abovementioned coefficients are defined, the next state of spin is acquired by the mathematical expression 4. As described in relation to FIG. 23, as a state of spin is provided with components in the x-axis direction and the z-axis direction, it also has the component in the X direction $x_i[t]$ and the component in the Z direction $z_i[t]$ in Mathematical expression 4. The $x_i[t]$ denotes force in the X direction at the time t and $z_i[t]$ denotes force in the Z direction at the time t.

An expression of $z_i[t]$ basically has the similar configuration to $F_i[t]$ in Mathematical expression 3, however, the expression has $\alpha[t]$ as a schedule coefficient. Besides, $z_i[t]$ is basically determined by a transverse magnetic field γ, however, it has (1−α[t]) as a coefficient.

Figure 25:
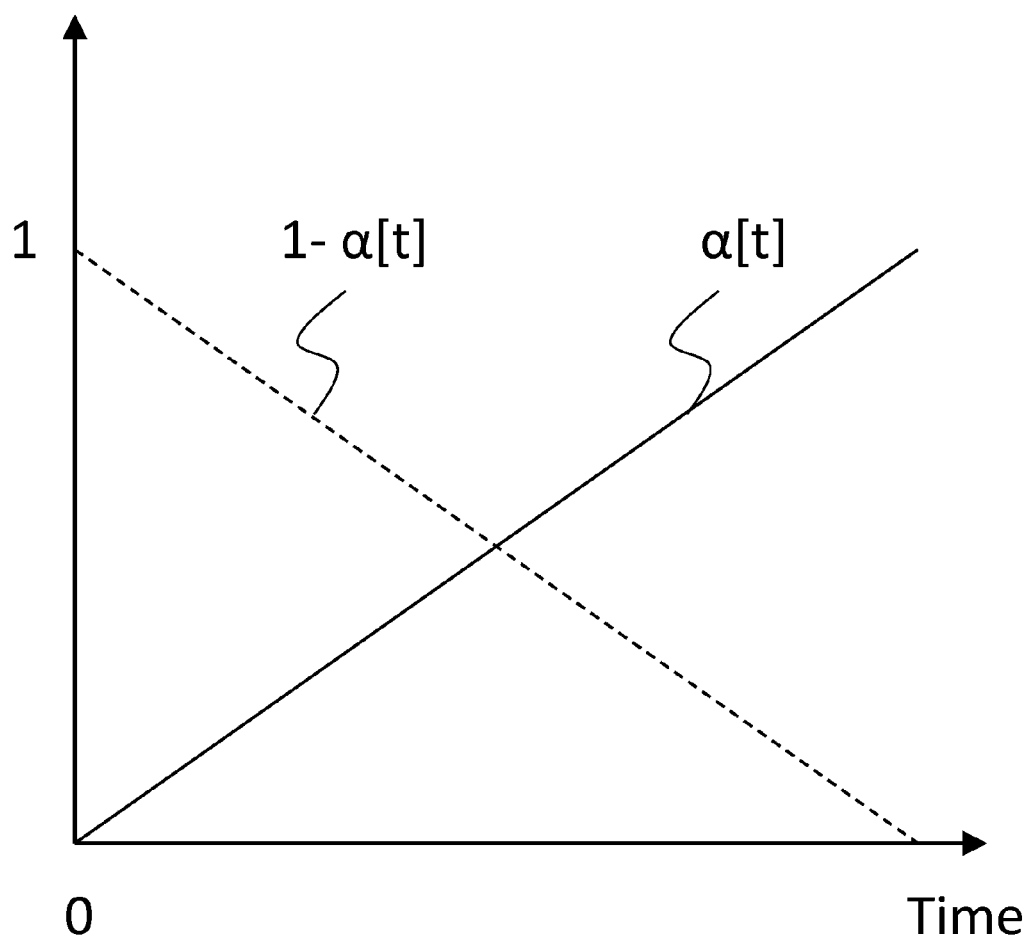
FIG. 25 is a graph showing an example of a schedule coefficient $\alpha[t]$.

FIG. 25 is a graph showing an example of the schedule coefficient α[t]. Time for the search of the ground state (an interaction frequency) is defined on an axis of abscissas and α[t] (normalized to be values of 0 to 1) is defined on an axis of ordinates. FIG. 25 shows an example that α[t] is a linear function, however, the present invention is not limited to this. α[t] may also be a quadratic function, may also be curved, and may be gradually varied. The schedule coefficient α[t] sets which of force in the X direction or force in the Z direction is made dominant when the next state is determined, normally, the schedule coefficient takes 0 at the beginning of the search of the ground state, and it takes a value of 1 at the end as shown in FIG. 25. That is, $z_i[t]$ in Mathematical expression 4 takes 0 at the beginning of the search of the ground state and takes a maximum value in an absolute value at the end. Besides, as 1−α[t] is reversely inclined, $x_i[t]$ in Mathematical expression 4 is γ at the beginning of the search of the ground state and takes a value of 0 at the end. The action of the schedule coefficient is equivalent to gradually lowering the transverse magnetic field γ and a phenomenon like quantum annealing is simulated.

The random noise $r_i[t]$ successively prevents a value in parentheses on the right side of $z_i[t]$ in Mathematical expression 4 from being zero in this embodiment in which values of spin and the coefficient can take 0. As described above, as the schedule coefficient α[t] is 0 at the beginning of the search of the ground state, all $z_i[t]$ are 0. Therefore, all $\delta_i[t+1]$ are also 0 and values of all spins are 0. In computing $z_i[t+1]$ which is the next interaction, α[t] is not 0, however, as a value of spin is 0, $z_i[t+1]$ is also 0 without the random noise $r_i[t]$ on a condition that an external magnetic field $h_i$ is 0, this state continues to end, and no solution can be acquired. Then, when no external magnetic field exists, random noise $r_i[t]$ is introduced to escape from a state that a value of spin is 0.

(2-3) Configuration of Ising Chip for Simulating Quantum Annealing

As described above, in this embodiment, phases of a superposed state is unlimited utilizing the state in which spin exists with an upward state (+1) and a downward state (−1) of the spin superposed. In observing, +1 or −1 is stochastically observed. To model a state close to this state, spin is multivalued. That is, phases of force that acts on spin are represented using an intermediate value between +1 and −1 (a digitized multiple value).

Configuration that realizes this situation by the Ising chip will be described below. As the basic configuration complies with "(1) Basic configuration of Ising chip", different parts will be described below.

Figure 26:
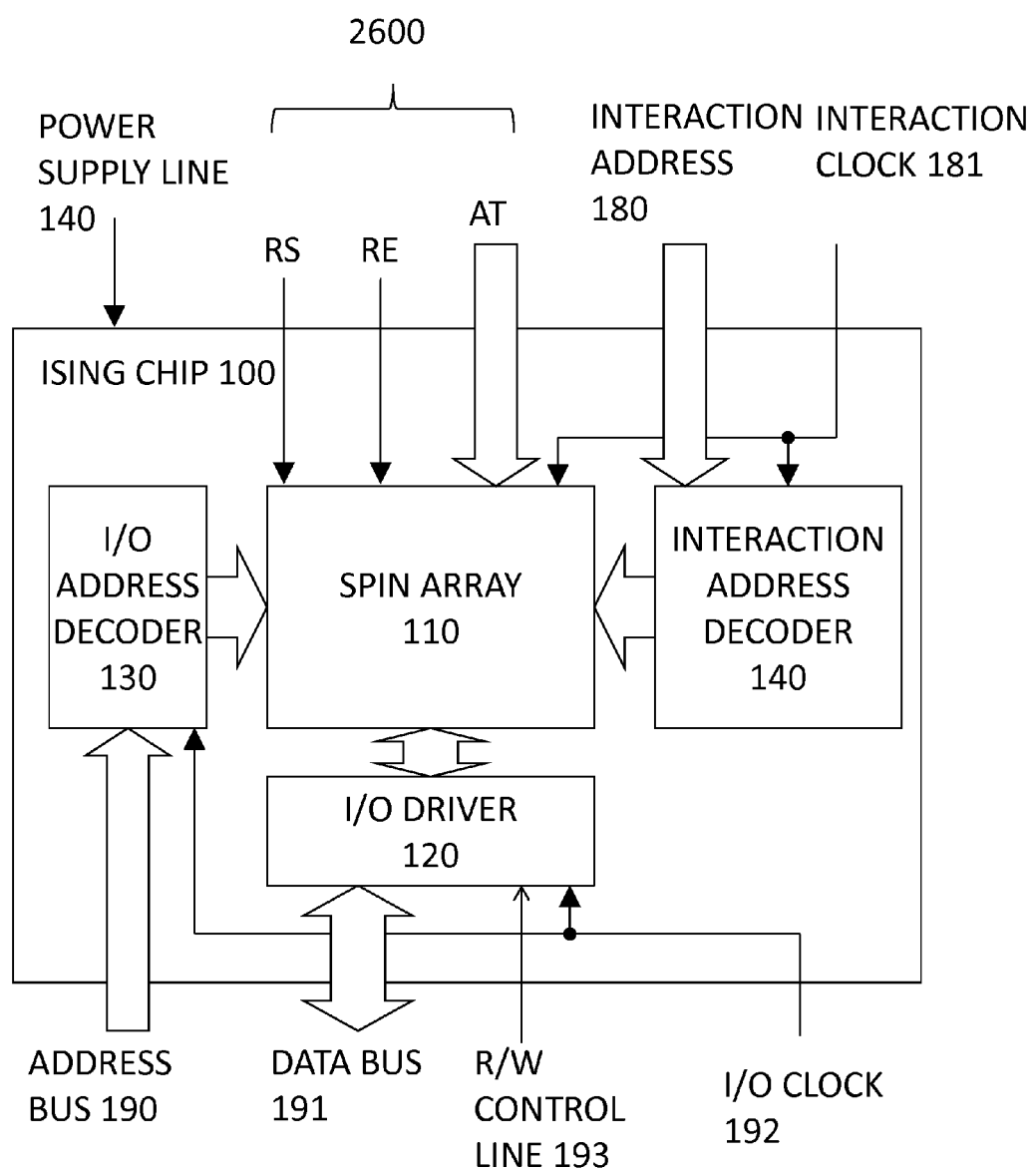
FIG. 26 is a block diagram showing the Ising chip provided with a randomness control interface.

FIG. 26 is a block diagram showing the Ising chip that simulates quantum annealing. The basic configuration is similar to that shown in FIG. 6, however, the random number generator 150, the bit controller 151 and the random number generation clock 160 are omitted. These are the configuration for controlling the transition probability of spin in simulated annealing. In quantum annealing, a randomness control interface 2600 is provided in place of these. A schedule control signal (AT), a random pulse string (RS) and a random effect control signal (RE) are input to the randomness control interface 2600. Here, the schedule control signal (AT) corresponds to the schedule coefficient α[t] in Mathematical expression 4. The random pulse string (RS) corresponds to the random noise $r_i[t]$ in Mathematical expression 4. The random effect control signal (RE) controls the application of the random noise $r_i[t]$.

Figure 27:
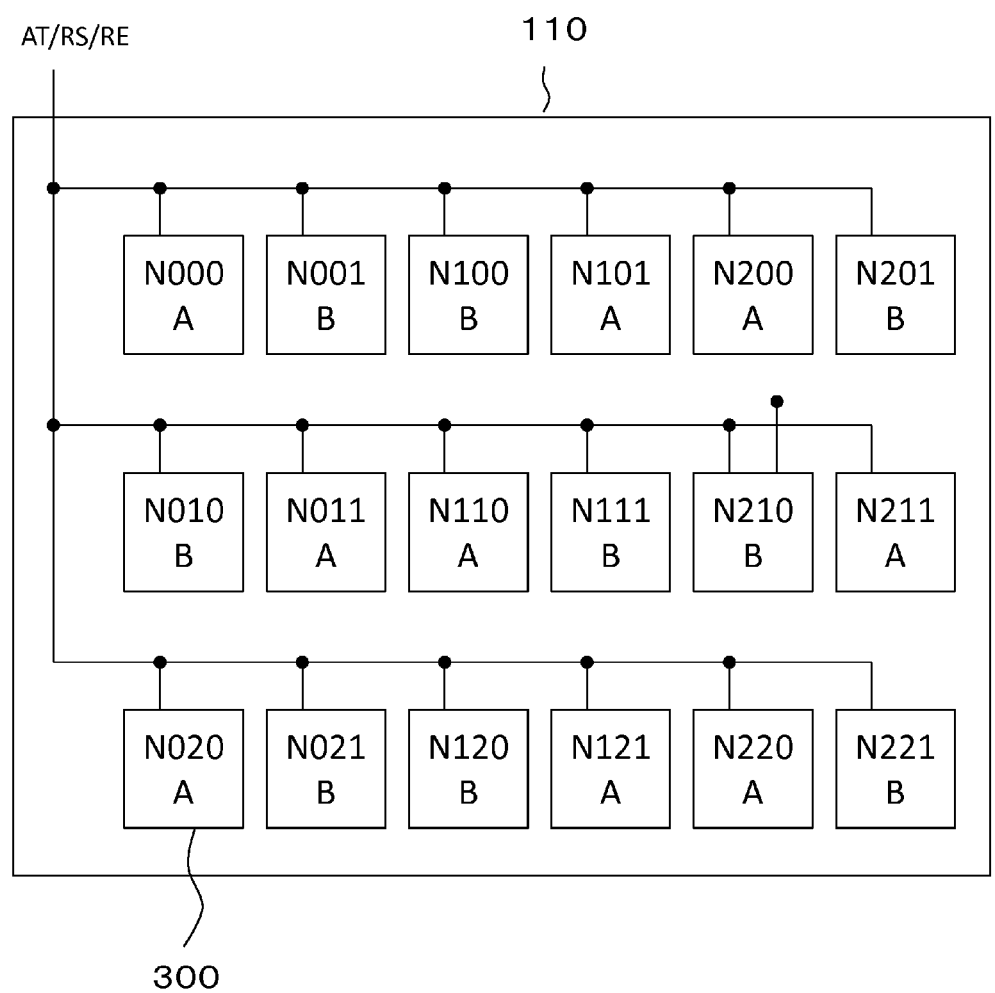
FIG. 27 is a block diagram showing wire binding the randomness control interface and the spin unit.

FIG. 27 is a block diagram showing the spin unit 300 in the spin array 110 shown in FIG. 26. The schedule control signal (AT), the random pulse string (RS) and the random effect control signal (RE) respectively input to the randomness control interface 2600 are supplied to each spin unit 300. These signal lines are independently configured, however, they are shown as one line for convenience. ID such as N000 and codes of A, B are allocated to the spin unit 300. A and B show distinction between groups in which interaction is alternately executed in the interaction address decoder 140 to prevent adjacent spins from being simultaneously rewritten.

Figure 28:
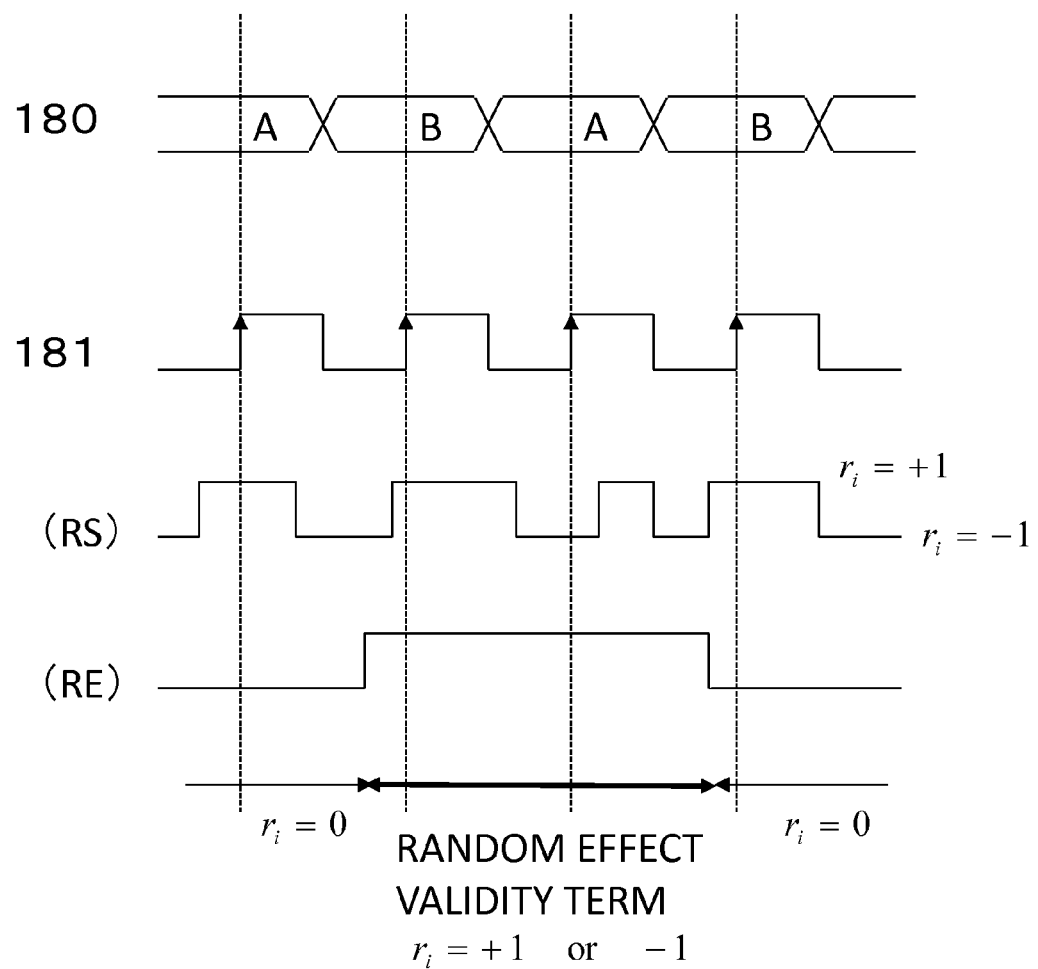
FIG. 28 is a timing chart showing relation among a random pulse string (RS), a random effect control signal (RE) and a clock.

FIG. 28 shows the random pulse string (RS) and the random effect control signal (RE) respectively input to the spin unit shown in FIG. 27. The interaction address 180 and the interaction clock 181 make the groups of A, B of the spin units alternately cause interaction. This configuration is similar to that shown in FIG. 6. The random pulse string $r_i[t]$(RS) is not limited to 1 bit, however, in this example, the random pulse string shall be a 1-bit pulse that takes a value of +1/−1. This signal can be generated in a normal random number generator. The random effect control signal (RE) makes the random pulse string $r_i[t]$(RS) valid while this signal is at a high level and makes the random pulse string invalid while the signal is at a low level. While the random pulse string $r_i[t]$ is invalid, a value of $r_i[t]$ is 0 and while it is valid, the value of $r_i[t]$ is a random value of +1 or −1. Normally, at the beginning of the search of the ground state, the random pulse string $r_i[t]$ is made valid.

Figure 29:
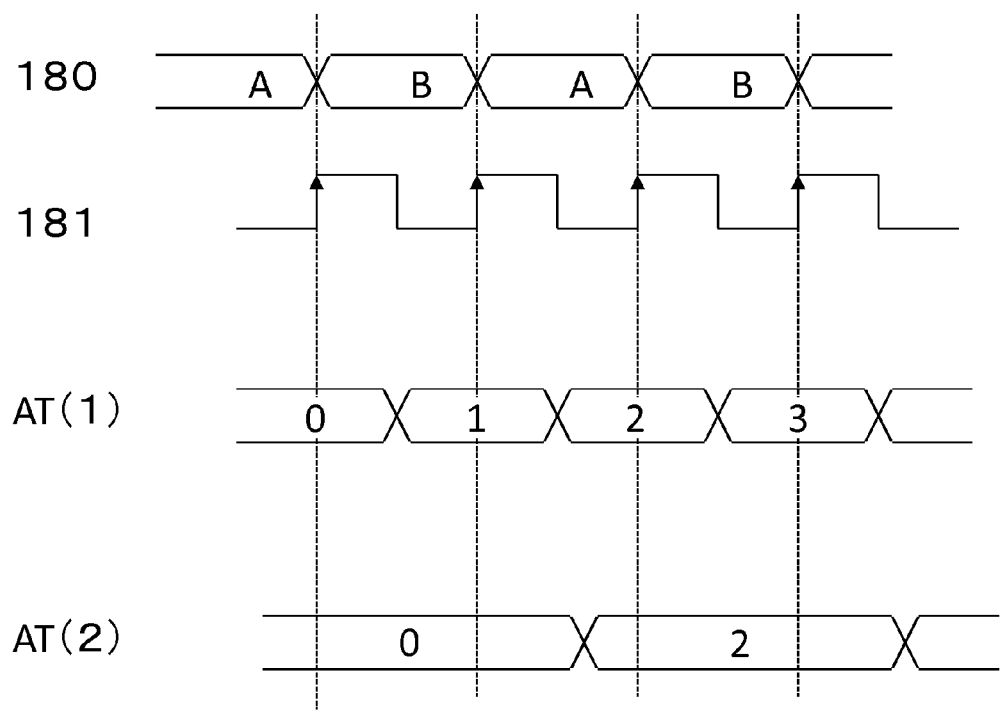
FIG. 29 is a timing chart showing relation among an interaction address 180, an interaction clock 181 and a schedule control signal (AT)

FIG. 29 shows relation among the interaction address 180, the interaction clock 181 and the schedule control signal (AT). In FIG. 29, an example of two types of AT (1) and AT (2) is shown. The schedule control signal (AT) is a signal a value of which gradually increases as shown in FIG. 25, however, in the example of AT (1) and AT (2), they are a signal that gradually increases in synchronization with a clock. For example, as for the signal AT (1), a value increases by 1 in one clock cycle and as to the signal AT (2), a value increases by 2 in two clock cycles. In this case, when the maximum value of the signal AT is ATmax, α used for the operation of Mathematical expression 4 in the spin unit 300 is as follows.

$$\alpha = AT/AT\max$$

The degree of the increase of a value of the schedule control signal (AT) and a frequency of the increase are arbitrary, however, they have only to be set in consideration of contents of a problem to be solved, the precision of solution and processing time.

(2-4) Configuration of Spin Unit for the Simulation of Quantum Annealing

Figure 30:
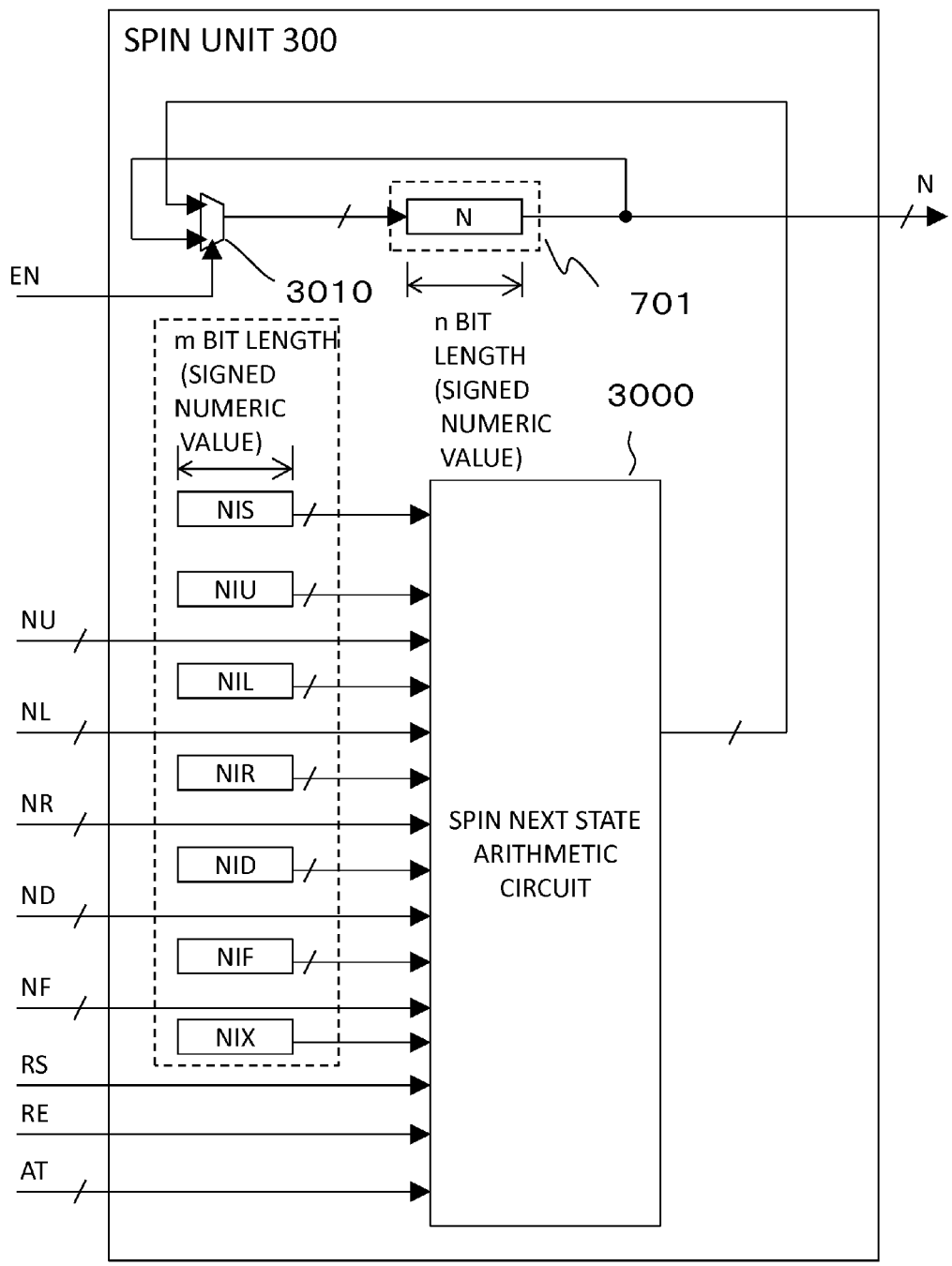
FIG. 30 is a circuit diagram showing the spin unit in one embodiment of the present invention.

FIG. 30 shows one example of the spin unit 300 shown in FIG. 27.

Values showing a value of each spin are input to a spin next state arithmetic circuit 3000 from NU, NL, NR, ND, NF which are adjacent spin. Besides, the schedule control signal (AT), the random pulse string (RS) and the random effect control signal (RE) are input to the spin next state arithmetic circuit 3000.

An enable signal (EN) is controlled by the interaction address 180 and allows/prohibits the rewrite of spin by interaction.

The interaction coefficient $J_{ij}$ is stored in NIU, NIL, NIR, NID and NIF which are a memory cell. A memory cell NIS stores the external magnetic field coefficient $h_i$ and a memory cell NIX stores the transverse magnetic field coefficient γ. Besides, a memory cell N stores a value of spin. In an example shown in FIG. 30, the memory cells that store the coefficients shall store an m-bit length signed numeric value and the memory cell that stores the spin shall store an n-bit length signed numeric value. For example, a high-order 1 bit shall express a positive or negative sign and low-order bits shall express a numeric value (an absolute value).

The abovementioned coefficients are input to the spin next state arithmetic circuit 3000. The value of the spin functions as input to the adjacent spin unit.

The spin next state arithmetic circuit executes operation shown in Mathematical expression 4 and outputs $\delta_i[t+1]$ which is the next state of the spin. The output functions as input to a multiplexer 3010 and when an enable signal (EN) is 1, the value of the spin in the memory cell N is rewritten. When the enable signal (EN) 0, the value of the spin in the memory cell N is not rewritten.

(2-5) Whole System and Process Flow

The basic whole system of the Ising chip that searches the ground state by pseudo-quantum annealing is also similar to that shown in FIG. 7. Besides, a process flow is similar to that shown in FIG. 16.

Referring to FIGS. 16 and 17, an item specific to the pseudo-quantum annealing will be described below.

FIG. 16 shows the outline of the procedure for controlling the Ising chip 100 by the CPU 210 and searching the ground state in the information processor 200. Data of a problem to be solved is stored in the HDD 260. Each step is executed by a program stored in the RAM 220 and executed in the CPU 210. At this time, a user may also input necessary information. Besides, the information processor 200 can be connected to an external server and others via a network interface to suitably utilize resources of the server.

In the step S1600, an interaction coefficient of the Ising model that represents a target problem, an external magnetic field coefficient and a transverse magnetic field coefficient are generated. In this embodiment, the interaction coefficient, the external magnetic field coefficient and the transverse magnetic field coefficient shall be able to take a multiple value. The transverse magnetic field coefficient γ may also be a value common to each spin unit.

In the step S1601, the spin allocation map is generated. In this embodiment, the memory map shown in FIG. 12 also has only to be generated, however, the memory cell that stores a numeric value shall be a memory cell that can store a multiple value. When the transverse magnetic field coefficient γ is common to each spin unit, the memory cell that stores the transverse magnetic field coefficient can be omitted and the transverse magnetic field coefficient can be input from an external device outside the Ising chip.

In the step S1602, the initial spin array is generated. In this embodiment, as a value of spin has no effect in a first step for searching the ground state, numeric values may also have the same value, however, an initial value of spin is normally a random value.

In the step S1603, the coefficients and the initial spin array are written to the spin array on the basis of the memory map.

In steps following the step S1603, a process specific to the pseudo-quantum annealing will be described below. The process is different between a case that the external magnetic field coefficient is 0 and a case that it is not 0.

(2-5-1) Case that One or More Spins Having External Magnetic Field Coefficient (≠0) Exists/Exist A flow when one or more spins having an external magnetic field coefficient (≠0) exists/exist will be described below. However, in the following example, selection in the flow is judged depending upon whether one spin which is not 0 exists or not, however, selection in the flow may also be judged depending upon whether the number of spins which are 0 is equal to or smaller than a predetermined number (a threshold) or not.

Figure 31:
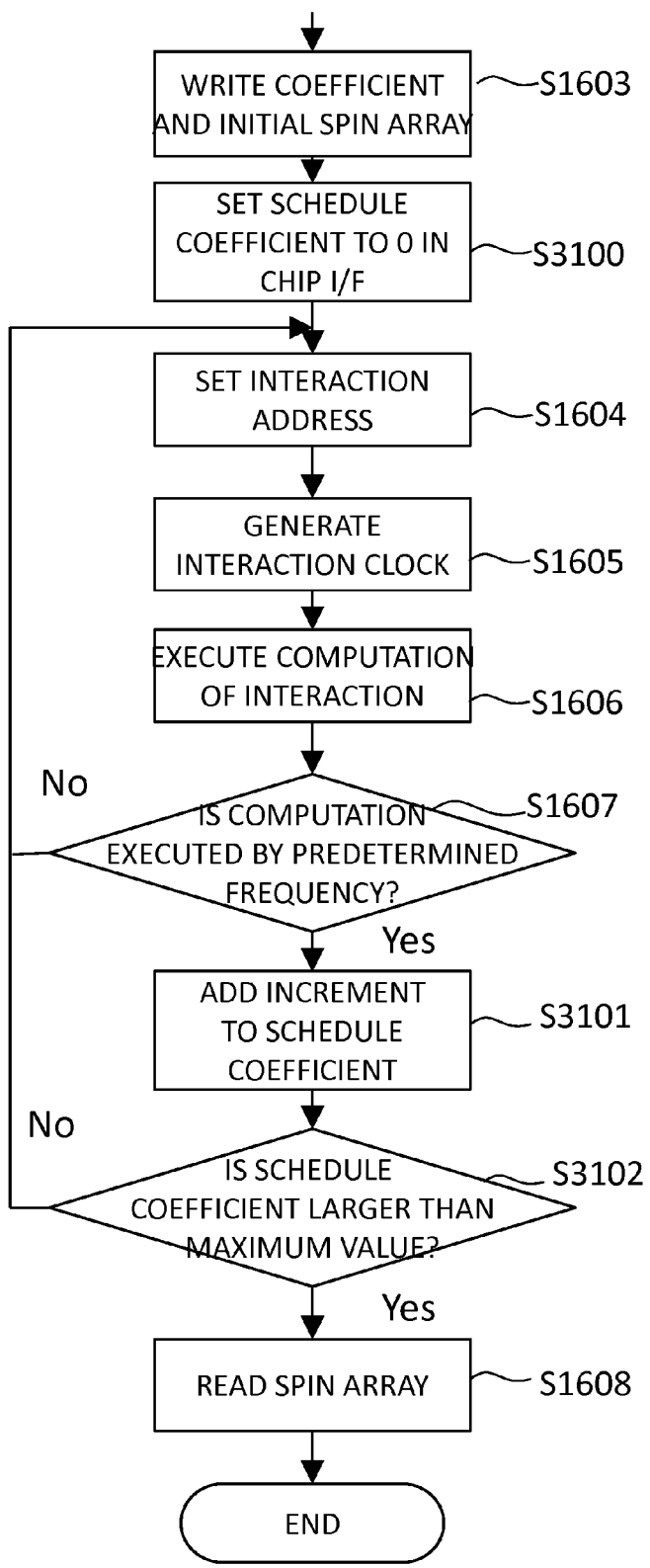
FIG. 31 is a flowchart showing a ground state search process equivalent to one embodiment of the present invention.

FIG. 31 shows the flow including modification in the steps following the step S1603 shown in FIG. 16. The same reference numeral as that shown in FIG. 16 basically denotes the same processing.

In a step S3100, a value of the schedule coefficient α[t] is set to 0. The schedule coefficient α[t] is supplied to the spin unit as a schedule control signal (AT).

In a step S1604, an interaction address is set and for example, the first group and the second group in the spin array are alternately designated.

In a step S1605, clocks for the first group and the second group in the spin array are generated.

In a step S1606, a value of the spin array is read on the basis of the interaction address and according to the interaction clock, a state of the next spin is determined, and the spin is rewritten. At this time, in this embodiment, control by the schedule control signal (AT) is made without rewriting spin at predetermined probability at random as in the example shown in FIG. 6.

The schedule control signal (AT) is a signal that controls the weight of the transverse magnetic field coefficient γ used for computing the energy function. Hereby, an effect in computing the energy function of the transverse magnetic field coefficient can be varied. In the examples shown in FIG. 30 and Mathematical expression 4, the transverse magnetic field coefficient γ is stored in the memory cell in the spin unit and is multiplied by (1−α[t]) determined by the schedule control signal (AT), however, the present invention is not limited to this. Besides, when the transverse magnetic field coefficient γ is common to each spin unit, the transverse magnetic field coefficient γ is not required to be stored in the memory cell in the spin unit and can also be supplied as the schedule control signal (AT) itself.

In a step S1607, a frequency of computing interaction is counted. When the computation is not executed by a predetermined frequency, the computation of interaction is executed again. When the computation is executed by the predetermined frequency, the schedule coefficient is incremented in a step S3101. Table 1 shows an example of the predetermined frequency which is a branch condition in S1607. In this example, the schedule coefficient is incremented by 0.2 and a maximum value is 1. In the example in Table 1, the schedule coefficient an initial value of which is set to 0 is incremented by 0.2 in S3101 when interaction is made 100 times and the schedule coefficient becomes 0.2. When interaction is further made 100 times at the schedule coefficient of 0.2, the schedule coefficient is incremented by 0.2 in S3101 and the schedule coefficient becomes 0.4. As the schedule coefficient can be controlled by the schedule control signal (AT) via the randomness control interface 2600, it can be used in the logical circuits of all spin units in common.

The schedule control signal may also be the coefficient itself as shown in Table 1 and a predetermined value (for example, 0,2) may also be added in accordance with timing in the spin unit as a signal showing only timing.

TABLE 1

| Schedule coefficient α[t]α[t] | Interaction frequency | Predetermined frequency (Total frequency) | 1−α[t] |
|---|---|---|---|
| 0 | 100 times | 100 times | 1 |
| 0.2 | 100 times | 200 times | 0.8 |
| 0.4 | 100 times | 300 times | 0.6 |
| 0.6 | 100 times | 400 times | 0.4 |
| 0.8 | 50 times | 450 times | 0.2 |
| 1 (maximum value) | 10 times | 460 times | 0 |

In S3102, it is checked whether the schedule coefficient exceeds a maximum value or not. When the maximum value is 1, interaction is continued until the schedule coefficient exceeds the maximum value 1 and when the schedule coefficient exceeds the maximum value, a spin array is read in the step S1608. In an example shown in Table 1, when the schedule coefficient becomes 1.2, a spin array is read.

A value of the read spin is not a binary of +1 or −1 and is normally an intermediate value. This is equivalent to an expectation value of a value of spin, however, as solution is required to be determined to be +1 or −1, a value of spin is output as +1 when the value of the spin is larger than 0 and the value of the spin is output as −1 when it is smaller than 0. When a value of spin is 0, the value of the spin is determined and output at random. This spin array is solution.

When the external magnetic field coefficient exists for the abovementioned all spins, the random pulse string (RS) and the random effect control signal (RE) are not used.

The abovementioned control is made by executing a problem conversion program and the Ising chip control program respectively stored in the RAM 220 by the CPU 210. Such setting shown in Table 1 may also be installed in a program and a user may also input it from an external device.

(2-5-2) Case that there is not External Magnetic Field Coefficient of all Spins (=0)

Next, a flow when there is not the external magnetic field coefficient of all spins (=0) will be described. As described above, as spin having no external magnetic field coefficient is unchanged in a state of 0, random effect control is made as a pseudo-external magnetic field.

The flow here is basically similar to the flow shown in FIG. 31. However, the following is different.

In S3100, the schedule coefficient is set to 0 and the random effect control signal (RE) is enabled. By this setting, in subsequent interaction computation (Mathematical expression 4), the random noise coefficient $r_i[t]$ of the random pulse string (RS) is turned valid. In the example shown in FIG. 28, $r_i[t]$ takes a 1-bit value of +1 or −1 at random, however, $r_i[t]$ may also take a multi-bit value.

In S3101, the schedule coefficient is incremented and the random effect control signal (RE) is disabled with the execution by a predetermined frequency of interaction as a condition. By this setting, in subsequent interaction computation (Mathematical expression 4), the random noise coefficient $r_i[t]$ of the random pulse string (RS) is turned invalid, that is, 0. As random noise is one type of disturbance for presenting spin from being unchanged in a state of 0, it is desirable that the random noise is invalidated in the end in which interaction is made by the predetermined frequency of the search of the ground state.

Table 2 shows one example of random effect control. In this example, until interaction is made 300 times, the random effect control signal (RE) is enabled (EN) and is disabled (DS) after three hundred first time. In the example of the random effect control signal (RE) shown in FIG. 28, the random effect control signal is enabled (EN) when it is at a high level and is disabled (DS) when it is at a low level, however, if the random noise coefficient has only to be controlled, the present invention is not limited to this. The random effect control signal (RE) and the random pulse string (RS) can be used in each spin unit in common and therefore, the randomness control interface 2600 can be used. In the example shown in Table 2, random effect control is correlated with the control of the schedule coefficient, however, as shown in FIG. 27, each signal line is independently wired and may also be independently controlled.

TABLE 2

| Schedule coefficient] α[t] | Interaction frequency | Predetermined frequency (Total frequency) | 1−α[t] | RE |
|---|---|---|---|---|
| 0 | 100 times | 100 times | 1 | EN (HIGH) |
| 0.2 | 100 times | 200 times | 0.8 | EN (HIGH) |
| 0.4 | 100 times | 300 times | 0.6 | EN (HIGH) |
| 0.6 | 100 times | 400 times | 0.4 | DS (LOW) |

TABLE 2-continued

| Schedule coefficient] α[t] | Interaction frequency | Predetermined frequency (Total frequency) | 1-α[t] | RE |
|---|---|---|---|---|
| 0.8 | 50 times | 450 times | 0.2 | DS (LOW) |
| 1 (maximum value) | 10 times | 460 times | 0 | DS (LOW) |

(2-5-3) Case that there is No External Magnetic Field Coefficient of all Spins (=0)(Example 2)

Next, another flow when there is no external magnetic field coefficient of all spins (=0) will be described.

The flow here is basically similar to that shown in FIG. 31. However, the following is different.

In S1603, an external magnetic field coefficient of spin having no external magnetic field coefficient (=0) is set at random when the coefficient is written and a value of the external magnetic field coefficient $h_i$ is written. That is, as for the spin having no external magnetic field coefficient, a dummy external magnetic field is written. A memory for writing the external magnetic field coefficient is the memory cell shown as NIS in FIG. 30. Writing and rewriting to the memory cell can be performed via an SRAM convertible interface.

In S3101, the schedule coefficient is incremented and the dummy external magnetic field of spin having no external magnetic field coefficient is rewritten to 0 with the execution by a predetermined frequency of interaction as a condition. By this setting, the spin having no external magnetic field coefficient is restored to a proper state. As the dummy external magnetic field is one type of disturbance for preventing spin from being unchanged in a state of 0, it is desirable that the dummy external magnetic field is turned 0 in the end in which interaction is made by the predetermined frequency of the search of the ground state.

Table 3 shows one example of dummy external magnetic field control. In this example, until interaction is made 300 times, a dummy external magnetic field (random) is applied to spin having no external magnetic field coefficient. After the three hundred first time, a value in a memory is rewritten to 0 so as to turn the dummy external magnetic field 0. Such control can be made using the randomness control interface 2600. In the example shown in Table 3, rewriting the external magnetic field coefficient is correlated with the control of the schedule coefficient, however, they may also be independently controlled. When they are independently controlled, wiring for controlling an external magnetic field is required to be added to the wiring shown in FIG. 27.

TABLE 3

| Schedule coefficient α[t] | Interaction frequency | Predetermined frequency (Total frequency) | 1-α[t] | External magnetic field $h_i$ |
|---|---|---|---|---|
| 0 | 100 times | 100 times | 1 | random |
| 0.2 | 100 times | 200 times | 0.8 | random |
| 0.4 | 100 times | 300 times | 0.6 | random |
| 0.6 | 100 times | 400 times | 0.4 | 0 |
| 0.8 | 50 times | 450 times | 0.2 | 0 |
| 1 (maximum value) | 10 times | 460 times | 0 | 0 |

In the abovementioned case, the random pulse string (RS) and the random effect control signal (RE) are required to be used.

(2-5-4) System Configuration

As it is clarified at a stage at which the coefficient is generated (S1600 in FIG. 16) whether spin having the external magnetic field coefficient of 0 exists or not when a problem is actually solved, it is desirable that at this time, branching into the flow (2-5-1) when there is one spin having the external magnetic field coefficient 0) or the flow ((2-5-2) or (2-5-3)) when all spins have no external magnetic field coefficient (=0) is made. For hardware configuration, in the example in (2-5-2), wiring for the random pulse string (RS) and the random effect control signal (RE) is required (see FIG. 27). In the example in (2-5-3), wiring for the random pulse string (RS) and the random effect control signal (RE) is not required, however, a function for detecting the memory cell having the external magnetic field coefficient of 0 and means for switching a value of the memory cell between a random value and 0 are required. These can be realized by an Ising chip control program in the form of software.

The search of the ground state shown in FIGS. 16 and 31 is executed in the interaction computation of plural times and one solution is acquired. As this solution is actually approximate solution of the ground state, the search of the ground state is executed plural times to acquire a more precise result and solution in which energy is the least may be final solution.

(2-6) Relation Among Data

Table 4 shows relation among a value of spin, multiple value data showing the value of the spin and stored in the memory cell N and solution. A state of quantum spin of the Ising model originally takes only +1 and −1 and a value between +1 and −1 is a state in which +1 and −1 are superposed (#1). When this value of the spin is expressed in 3-bit complement notation shown in FIG. 24 for example in the memory cell N 701 shown in FIG. 30 as an n-bit length signed numeric value, it becomes multiple value data of +3 to −3 (#2). This becomes +1, −1 and their intermediate value when this is converted to a spin state (#3). As this spin state $δ_i$ is acquired when the search of the ground state is finished, this is converted to either of +1 or −1 for solution (#4). As described above, in the present invention, the state in which +1 and −1 of spin are superposed is expressed as a discrete multiple value between +1 and −1 as data. Multivalue data N is not limited to an example shown in Table 4 if only the multiple value data corresponds to a spin state expressed at a multiple value.

TABLE 4

| #1 Spin state | #2 Multivalue data N | #3 Spin state δi expressed at multiple value | #4 Spin state of solution |
|---|---|---|---|
| +1 (Upward) | +3 | +1 | +1 |
| Superposition of +1 and −1 | +2 | +2/3 | +1 |
| Superposition of +1 and −1 | +1 | +1/3 | +1 |
| Superposition of +1 and −1 | 0 | 0 | Random |
| Superposition of +1 and −1 | −1 | −1/3 | −1 |
| Superposition of +1 and −1 | −2 | −2/3 | −1 |
| 1 (Downward) | −3 | −1 | −1 |

The abovementioned configuration may also be configured by a single computer or an arbitrary part of the input device, the output device, the processing unit and the storage may also be configured by another computer connected via a network. Both configurations are equivalent as an idea of the present invention and are unchanged.

In this embodiment, the similar function to the function configured by software can also be realized by hardware such as Field programmable gate array (FPGA) and Application specific integrated circuit (ASIC). Such a mode is also included in the scope of the present invention.

The present invention is not limited to the abovementioned embodiment and various variations are included. For example, a part of the configuration of a certain embodiment can be replaced with the configuration of another embodiment and the configuration of another embodiment can be added to the configuration of the certain embodiment. Besides, a part of the configuration of each embodiment can be added to the configuration of another embodiment, can be deleted, and can be replaced with the configuration of another embodiment.

What is claimed is:

1. A semiconductor device provided with a plurality of units, comprising:
   a first memory cell that stores a value which represents one spin of Ising model by three or more states;
   a second memory cell that stores an interaction coefficient showing interaction from another spin which exerts interaction on the one spin; and
   a logical circuit that determines the next state of the one spin on the basis of a function having a value which represents a state of the other spin and the interaction coefficient as a constant or a variable.

2. The semiconductor device according to claim 1, wherein the first memory cell that stores the value of the one spin of the Ising model represents at least three states of a state of +1, a state of −1 and a state of neither +1 nor −1 as the value of the one spin.

3. The semiconductor device according to claim 2, wherein the memory cell that stores the value of the one spin of the Ising model can represent a state of 0 as the state of neither +1 nor −1.

4. The semiconductor device according to claim 1, comprising:
   a memory cell for first bias that stores a first bias coefficient of the one spin,
   wherein a first pseudo-bias coefficient is temporarily stored in the memory cell for first bias; and
   an interface that converts the first pseudo-bias coefficient to 0 at arbitrary timing is provided.

5. The semiconductor device according to claim 1, comprising:
   an interface that receives a coefficient used in the logical circuits of all the units in common from an external device.

6. The semiconductor device according to claim 5, further comprising:
   a memory cell for second bias that stores a second bias coefficient of the one spin,
   wherein the second bias coefficient is used in computing the function; and
   the interface receives a schedule coefficient which varies an effect of the second bias coefficient in the computation of the function from the external device as the coefficient used in common.

7. The semiconductor device according to claim 5, comprising:
   a memory cell for first bias that stores a first bias coefficient of the one spin,
   wherein the interface receives a random pulse string that adds a random value to the first bias coefficient in the computation of the function and a random effect control signal that enables/disables the effect of the random pulse string from an external device as the coefficient used in common.

8. A semiconductor device, comprising:
   a plurality of units provided with:
   a first memory cell that stores a value of one spin of Ising model;
   a second memory cell that stores an interaction coefficient from another spin that exerts interaction on the one spin; and
   a logical circuit that determines the next state of the one spin on the basis of a function having the value of the spin in a system configured by the one spin and another spin and the interaction coefficient as a constant or a variable; and
   an interface that varies a value of the coefficient used in the computation of the function in the logical circuit in the plurality of units in common.

9. The semiconductor device according to claim 8, wherein the first memory cell that stores the value of the one spin of the Ising model stores a multiple value.

10. The semiconductor device according to claim 8, wherein the unit is provided with a third memory cell that stores an additional coefficient of the one spin as a value which has an effect on the coefficient used in the computation of the function.

* * * * *